United States Patent
Higuchi et al.

(10) Patent No.: US 11,508,525 B2
(45) Date of Patent: Nov. 22, 2022

(54) CAPACITOR HAVING TRENCHES ON BOTH SURFACES

(71) Applicant: KABUSHIKI KAISHA TOSHIBA, Minato-ku (JP)

(72) Inventors: Kazuhito Higuchi, Yokohama (JP); Susumu Obata, Yokohama (JP); Keiichiro Matsuo, Yokohama (JP); Mitsuo Sano, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 169 days.

(21) Appl. No.: 16/819,404

(22) Filed: Mar. 16, 2020

(65) Prior Publication Data

US 2020/0219656 A1   Jul. 9, 2020

Related U.S. Application Data

(63) Continuation of application No. PCT/JP2019/000351, filed on Jan. 9, 2019.

(30) Foreign Application Priority Data

Mar. 6, 2018   (WO) .................. PCT/JP2018/008585

(51) Int. Cl.
*H01G 4/33*   (2006.01)
*H01L 49/02*   (2006.01)

(52) U.S. Cl.
CPC .............. *H01G 4/33* (2013.01); *H01L 28/92* (2013.01)

(58) Field of Classification Search
CPC .......... H01G 4/33; H01G 4/012; H01G 4/385; H01L 28/92; H01L 21/822; H01L 27/04; H01L 28/75; H01L 28/91
See application file for complete search history.

(56) References Cited

U.S. PATENT DOCUMENTS

| 5,153,813 | A | 10/1992 | Oehrlein et al. |
| 5,258,321 | A | 11/1993 | Shimizu et al. |
| 5,508,542 | A | 4/1996 | Geiss et al. |

(Continued)

FOREIGN PATENT DOCUMENTS

| CN | 102800565 A | 11/2012 |
| JP | 01-183151 A | 7/1989 |

(Continued)

OTHER PUBLICATIONS

International Search Report dated Apr. 9, 2019 in PCT/JP2019/000351 filed on Jan. 9, 2019, 2 pages.

*Primary Examiner* — David M Sinclair
*Assistant Examiner* — Daniel M Dubuisson
(74) *Attorney, Agent, or Firm* — Oblon, McClelland, Maier & Neustadt, L.L.P.

(57) ABSTRACT

A capacitor according to an embodiment includes a substrate having a first surface and a second surface and provided with one or more first through holes each extending from the first surface to the second surface, a first conductive layer covering the first surface, the second surface, and side walls of the one or more first through holes, a second conductive layer facing the first surface, the second surface, and the side walls of the one or more first through holes, with the first conductive layer interposed therebetween, and a dielectric layer interposed between the first conductive layer and the second conductive layer.

8 Claims, 19 Drawing Sheets

(56) References Cited

U.S. PATENT DOCUMENTS

| | | | |
|---|---|---|---|
| 6,441,424 B1 | 8/2002 | Klose et al. | |
| 8,907,402 B2* | 12/2014 | Shinohara | H01L 27/11582 257/326 |
| 2002/0085336 A1* | 7/2002 | Winer | H01L 28/90 361/306.3 |
| 2002/0134581 A1 | 9/2002 | Figueroa et al. | |
| 2003/0085420 A1* | 5/2003 | Ito | H01L 28/91 257/E21.648 |
| 2007/0290300 A1* | 12/2007 | Kawakami | H01L 21/76898 438/109 |
| 2008/0180878 A1 | 7/2008 | Wang et al. | |
| 2008/0236870 A1* | 10/2008 | Kuwajima | H01G 4/248 174/126.2 |
| 2008/0285210 A1* | 11/2008 | Oh | H01G 9/15 29/25.03 |
| 2009/0052110 A1* | 2/2009 | Masuda | H01G 4/005 361/303 |
| 2009/0244808 A1* | 10/2009 | Ohtsuka | H01G 4/06 361/311 |
| 2009/0293277 A1 | 12/2009 | Uchiyama | |
| 2010/0110607 A1 | 5/2010 | Denatale et al. | |
| 2012/0146182 A1* | 6/2012 | Oganesian | H01L 28/40 257/532 |
| 2012/0181658 A1 | 7/2012 | Mohammed et al. | |
| 2012/0199949 A1* | 8/2012 | Lan | H01L 29/945 438/386 |
| 2012/0298413 A1* | 11/2012 | Mori | H01L 23/147 29/829 |
| 2012/0299153 A1 | 11/2012 | Kuan | |
| 2013/0127013 A1* | 5/2013 | Park | H01L 28/91 257/532 |
| 2013/0278568 A1 | 10/2013 | Lasiter et al. | |
| 2015/0371779 A1* | 12/2015 | Lim | H01G 4/33 29/25.42 |
| 2017/0062230 A1 | 3/2017 | Matsuo et al. | |
| 2017/0084613 A1* | 3/2017 | Hwang | H01L 27/10808 |

FOREIGN PATENT DOCUMENTS

| | | |
|---|---|---|
| JP | 05-304254 A | 11/1993 |
| JP | 11-195769 A | 7/1999 |
| JP | 3079021 B2 | 8/2000 |
| JP | 2009-291991 A | 12/2009 |
| JP | 2012-089743 A | 5/2012 |
| JP | 2017-050378 A | 3/2017 |
| TW | 200833188 A | 8/2008 |
| TW | 201430885 A | 8/2014 |

* cited by examiner

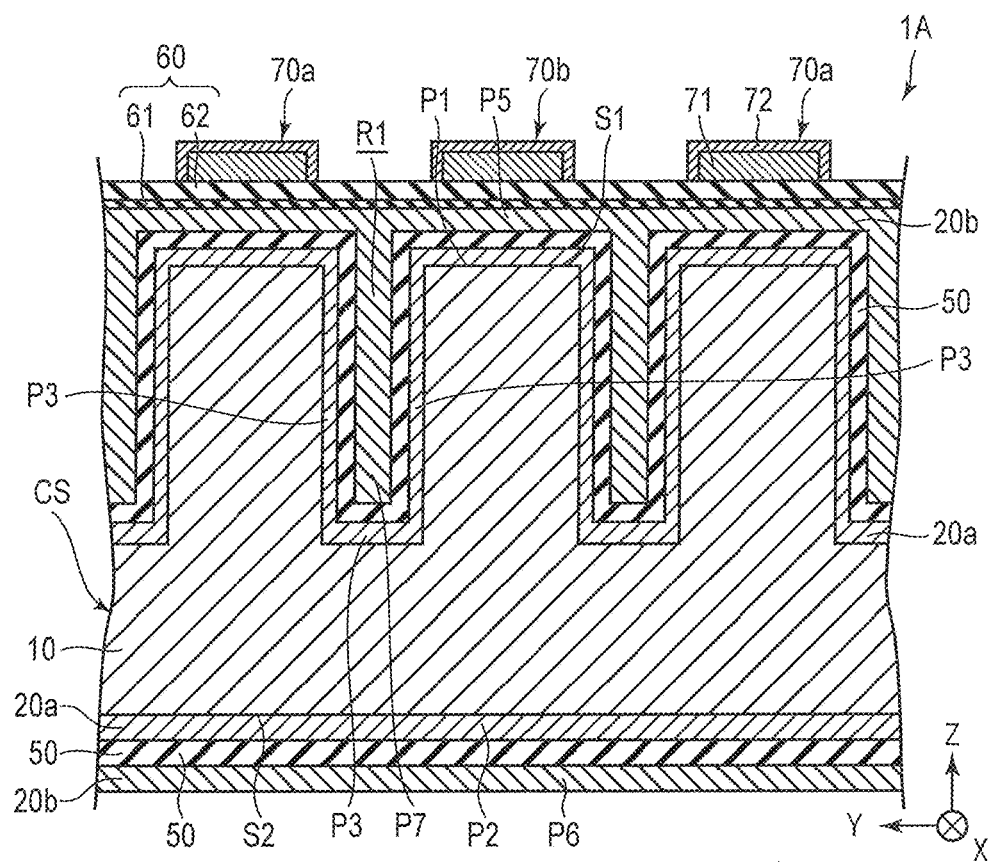
F I G. 2

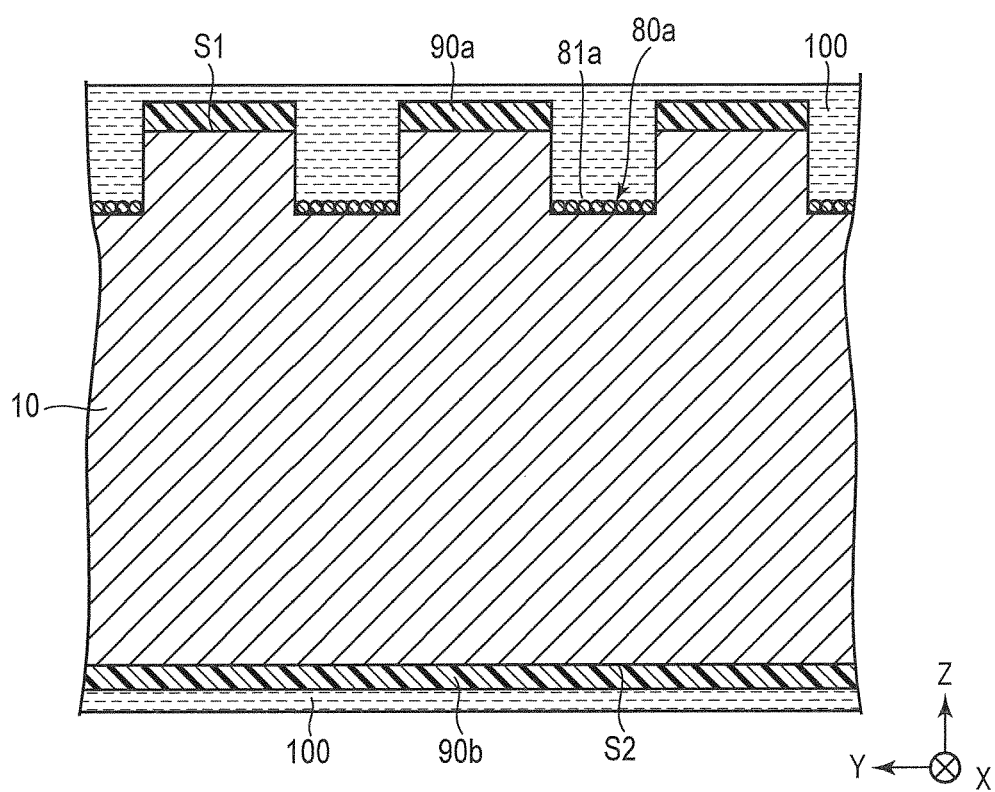
F I G. 9

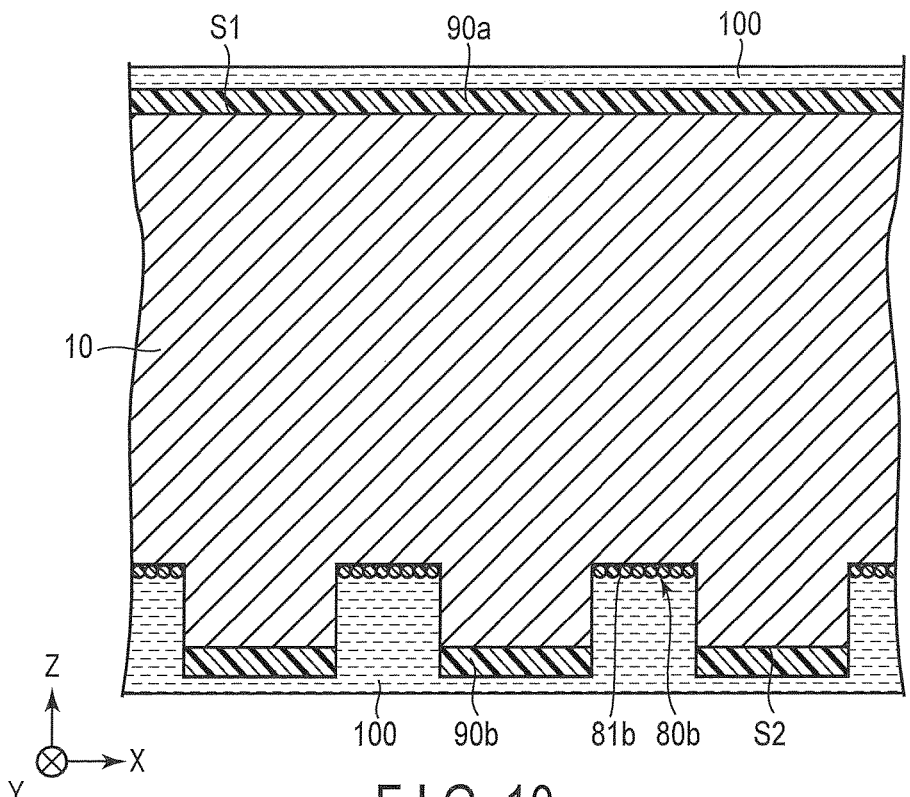
F I G. 10
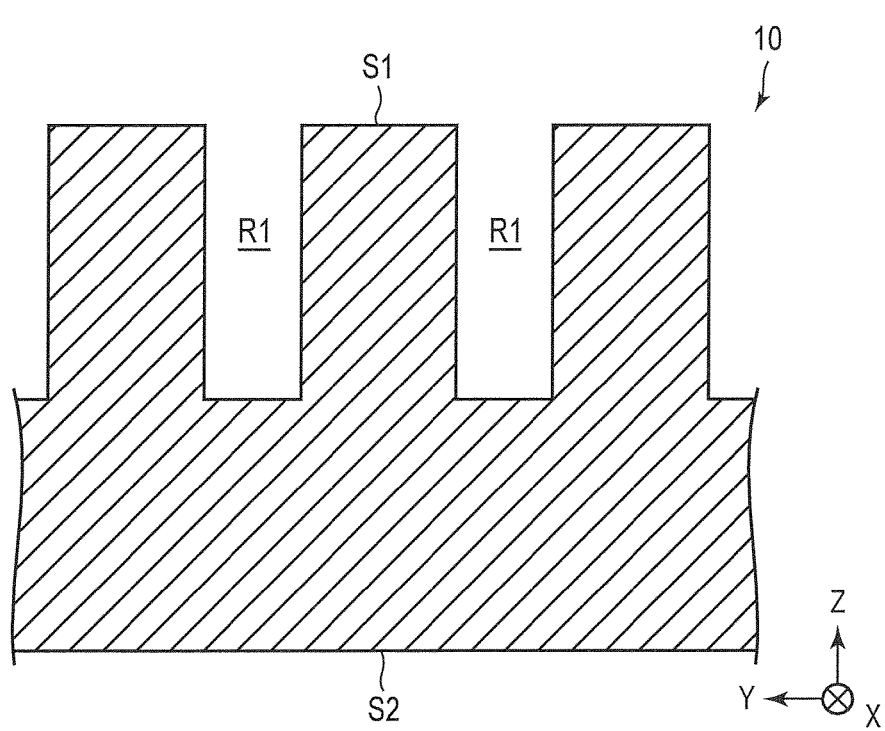
F I G. 11

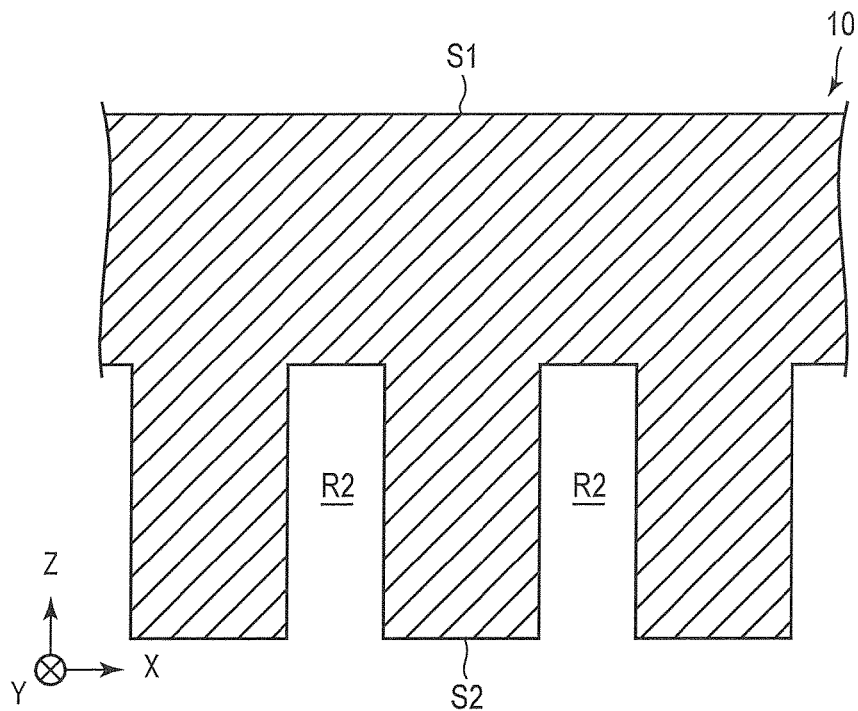
F I G. 12
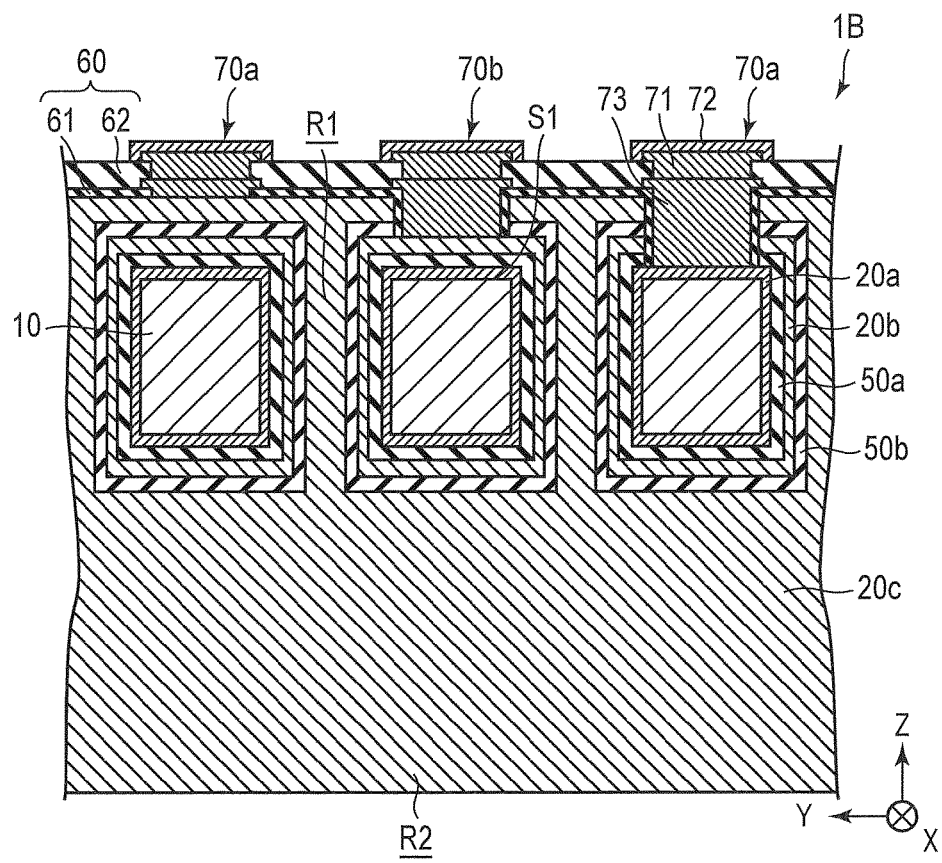
F I G. 13

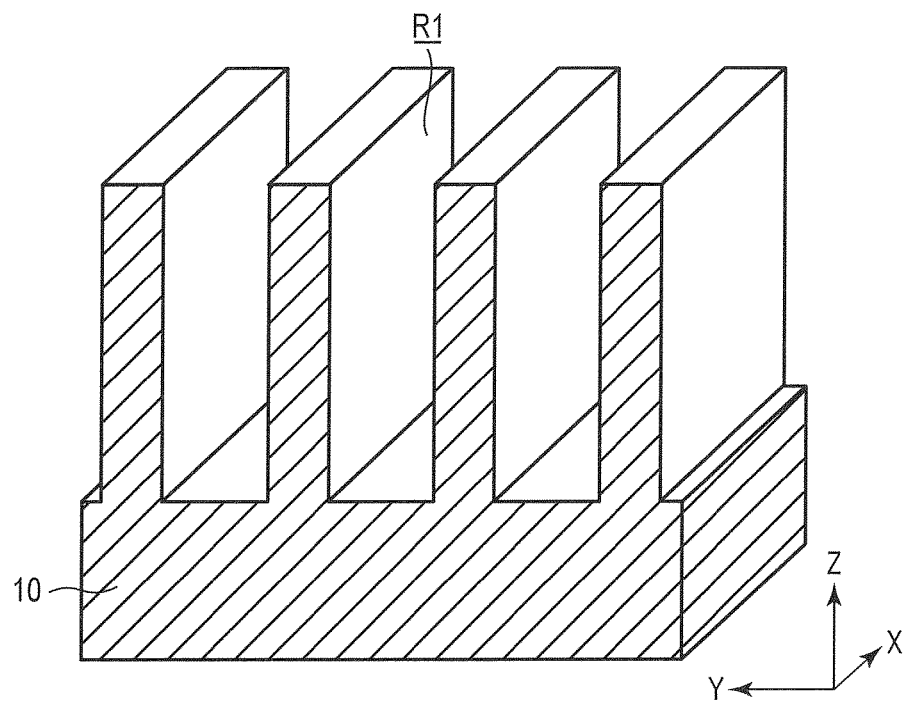
F I G. 16
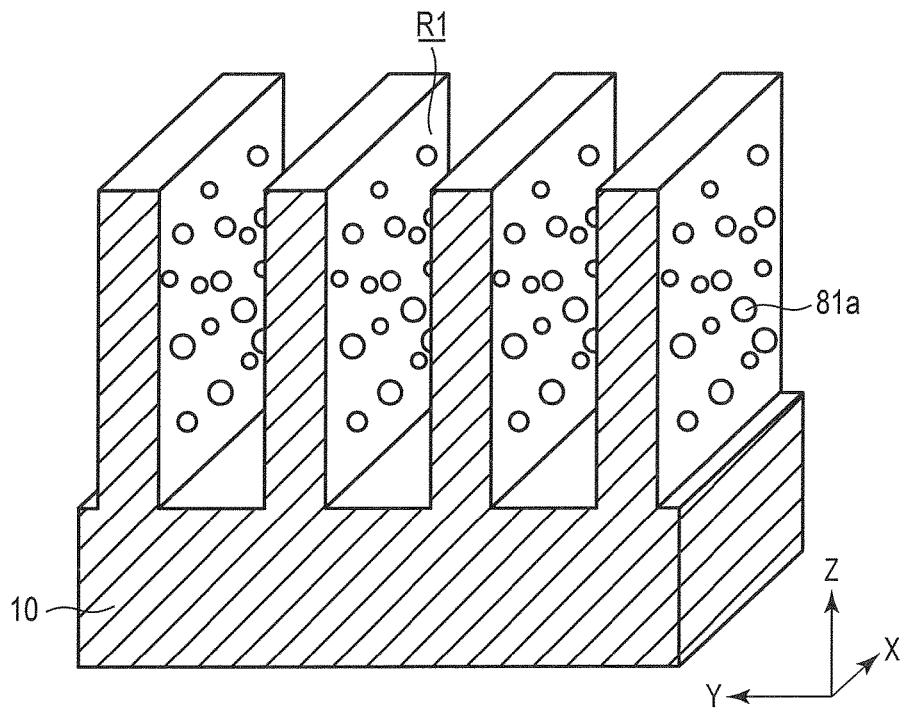
F I G. 17

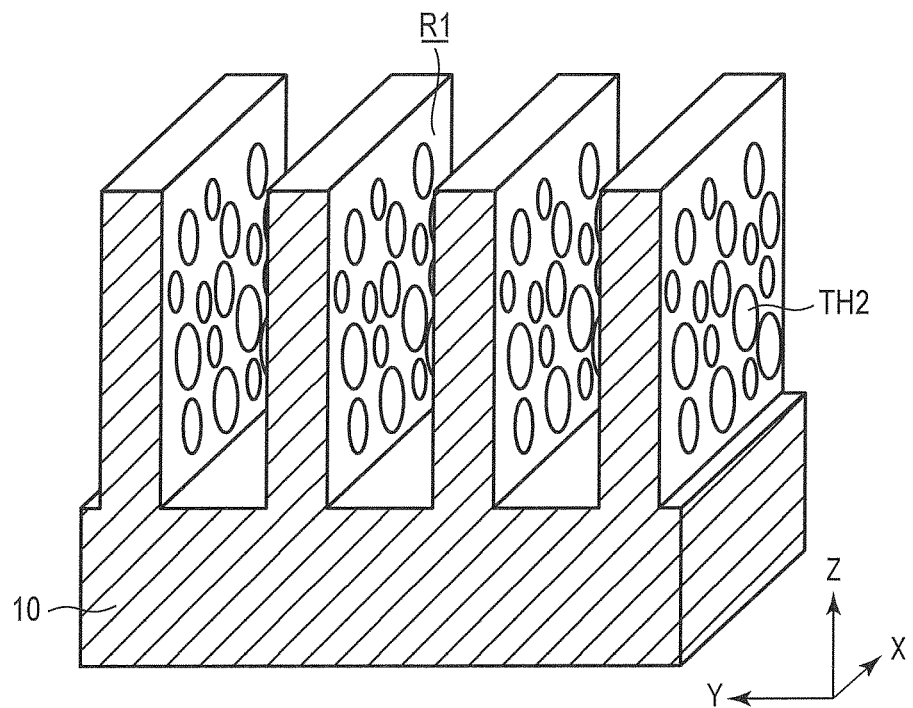
F I G. 18

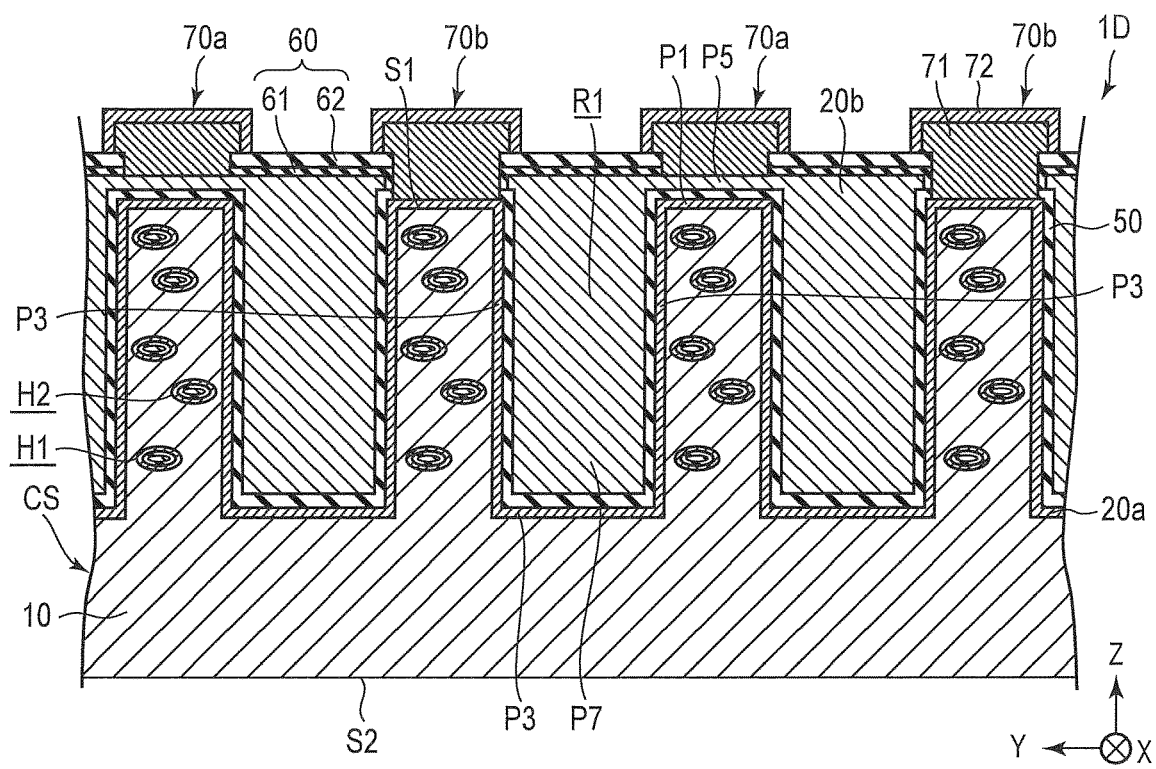
F I G. 20

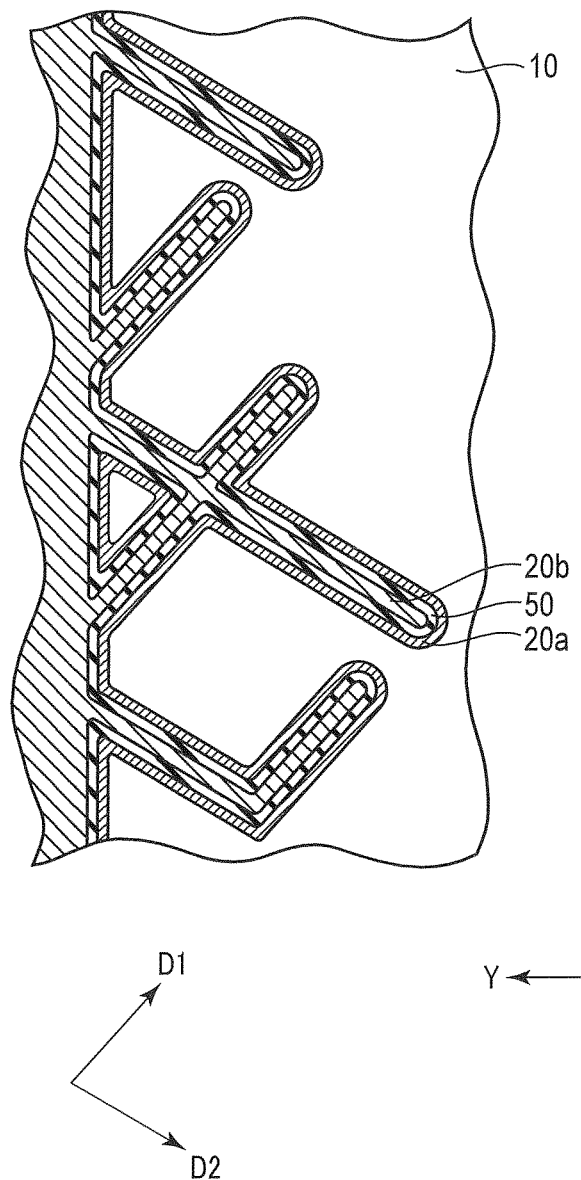
F I G. 22

CAPACITOR HAVING TRENCHES ON BOTH SURFACES

CROSS-REFERENCE TO RELATED APPLICATIONS

This application is a Continuation Application of PCT Application No. PCT/JP2019/000351, filed Jan. 9, 2019 and based upon and claiming the benefit of priority from prior PCT Application No. PCT/JP2018/008585, filed Mar. 6, 2018, the entire contents of all of which are incorporated herein by reference.

FIELD

Embodiments described herein relate generally to a capacitor and a manufacturing method thereof.

BACKGROUND

Many electrical and electronic devices include capacitors. Such a capacitor can be obtained, for example, by forming conductive layers and a dielectric layer on a silicon substrate.

BRIEF DESCRIPTION OF THE DRAWINGS

FIG. 2 is a cross-sectional view of the capacitor shown in FIG. 1;

FIG. 9 is a cross-sectional view schematically showing still another process in the manufacture of the capacitor shown in FIGS. 1 to 6;

FIG. 10 is another cross-sectional view schematically showing the process of FIG. 9;

FIG. 11 is a cross-sectional view schematically showing an example of a structure obtained by the processes of FIGS. 9 and 10;

FIG. 12 is another cross-sectional view of the structure shown in FIG. 11;

FIG. 13 is a cross-sectional view schematically showing a capacitor according to a second embodiment;

FIG. 16 is a perspective view schematically showing an example of a substrate provided with trenches that is used for the manufacture of the capacitor shown in FIG. 14;

FIG. 17 is a perspective view schematically showing one process in the manufacture of the capacitor shown in FIG. 14;

FIG. 18 is a perspective view schematically showing an example of a structure obtained by another process in the manufacture of the capacitor shown in FIG. 14;

FIG. 20 is a cross-sectional view schematically showing a capacitor according to a fifth embodiment;

FIG. 22 is a cross-sectional view taken along a line XXII-XXII of the capacitor shown in FIG. 21;

DETAILED DESCRIPTION

Figure 1:
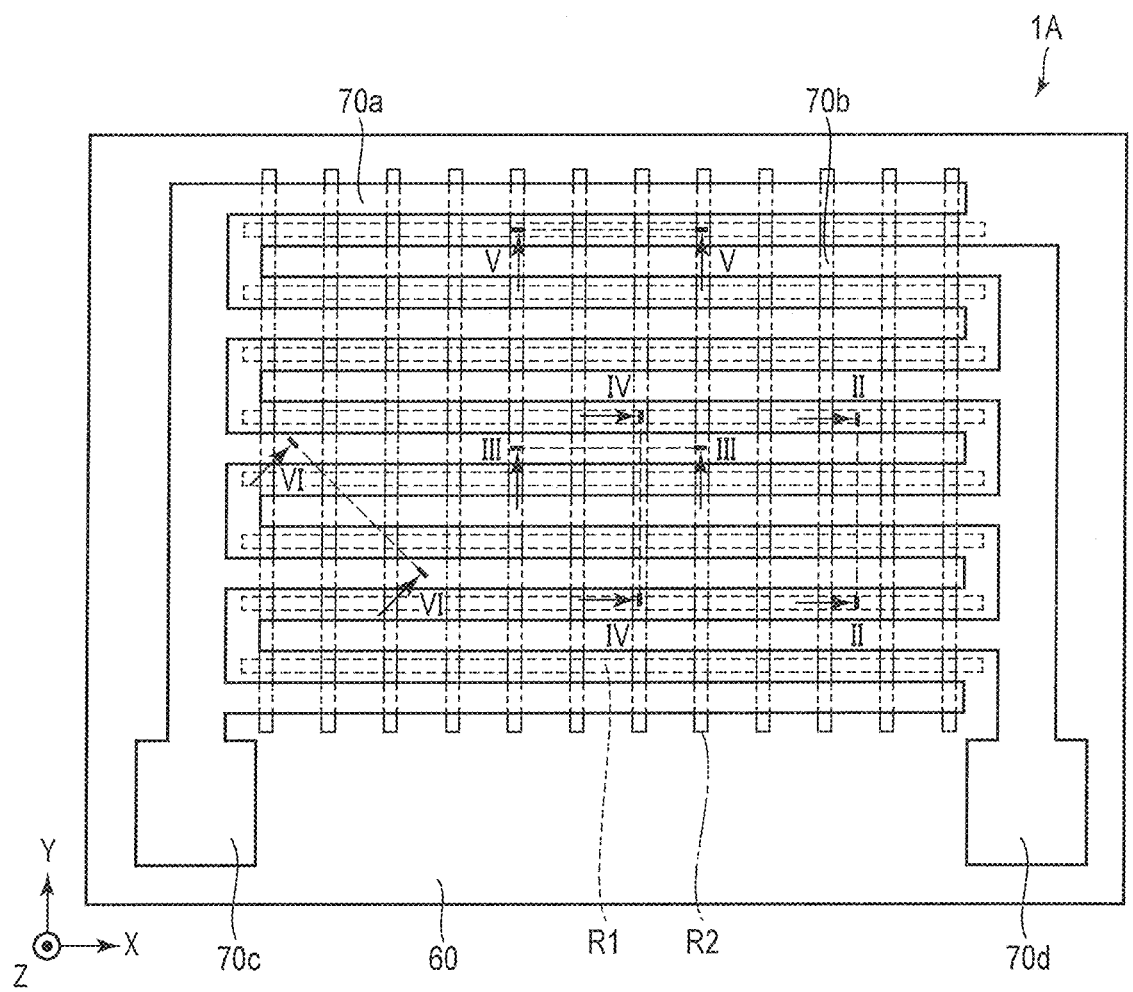
FIG. 1 is a plan view schematically showing a capacitor according to a first embodiment.

According to a first aspect, there is provided a capacitor comprising: a substrate having a first surface and a second surface and provided with one or more first through holes each extending from the first surface to the second surface; a first conductive layer covering the first surface, the second surface, and side walls of the one or more first through holes; a second conductive layer facing the first surface, the second surface, and the side walls of the one or more first through holes, with the first conductive layer interposed therebetween; and a dielectric layer interposed between the first conductive layer and the second conductive layer.

According to a second aspect, there is provided a capacitor comprising: a substrate having a first main surface and a second main surface, wherein a plurality of trenches are provided on the first main surface, and one or more portions each sandwiched between two adjacent ones of the plurality of trenches are provided with one or more through holes connecting one of the two adjacent trenches to the other; a first conductive layer covering the first main surface, side walls and bottom surfaces of the trenches, and side walls of the one or more through holes; a second conductive layer facing the first main surface, the side walls and the bottom surfaces of the trenches, and the side walls of the one or more through holes, with the first conductive layer interposed therebetween; and a dielectric layer interposed between the first conductive layer and the second conductive layer.

According to a third aspect, there is provided a method of manufacturing a capacitor, comprising: forming a first catalyst layer containing a first noble metal on a substrate such that a surface of the substrate is covered partially; etching the substrate with an assist from the first noble metal as a catalyst to form one or more first through holes in the substrate; forming a first conductive layer on the substrate in which the one or more first through holes are formed; forming a dielectric layer on the first conductive layer; and forming a second conductive layer on the dielectric layer.

According to a fourth aspect, there is provided a capacitor comprising: a substrate having a first main surface and a second main surface, wherein one or more first trenches are provided on the first main surface, and a plurality of first holes each extending in a first direction inclined with respect to side walls of the first trenches are provided on the side walls of the one or more first trenches; a first conductive layer covering the first main surface, the side walls and bottom surfaces of the first trenches, and side walls of the plurality of first holes; a second conductive layer facing the first main surface, the side walls and the bottom surfaces of the first trenches, and the side walls of the plurality of first holes, with the first conductive layer interposed therebetween; and a dielectric layer interposed between the first conductive layer and the second conductive layer.

According to a fifth aspect, there is provided a method of manufacturing a capacitor, comprising: forming one or more first trenches on a first main surface of a substrate having the first main surface and a second main surface; forming a first catalyst layer containing a first noble metal on side walls of the one or more first trenches such that the side walls of the one or more first trenches are covered partially; etching the side walls of the first trenches with an assist from the first noble metal as a catalyst to form a plurality of first holes on the side walls of the first trenches, each of the first holes extending in a first direction inclined with respect to the side walls of the first trenches; forming a first conductive layer on the substrate on which the plurality of first holes are formed; forming a dielectric layer on the first conductive layer; and forming a second conductive layer on the dielectric layer.

Embodiments will be explained in detail below with reference to the accompanying drawings. Note that the same reference numerals denote constituent elements which achieve the same or similar functions throughout all the drawings, and a repetitive explanation will be omitted.

First Embodiment

Figure 3:
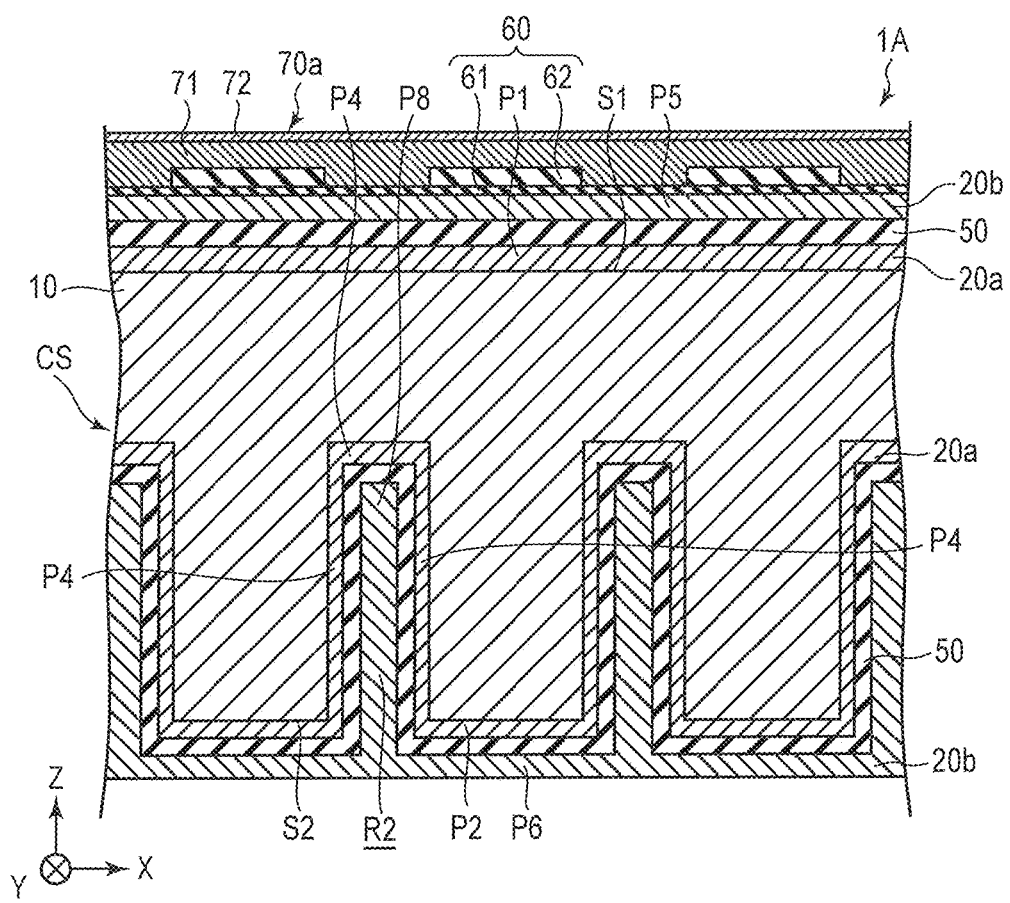
FIG. 3 is another cross-sectional view of the capacitor shown in FIG. 1.
Figure 4:
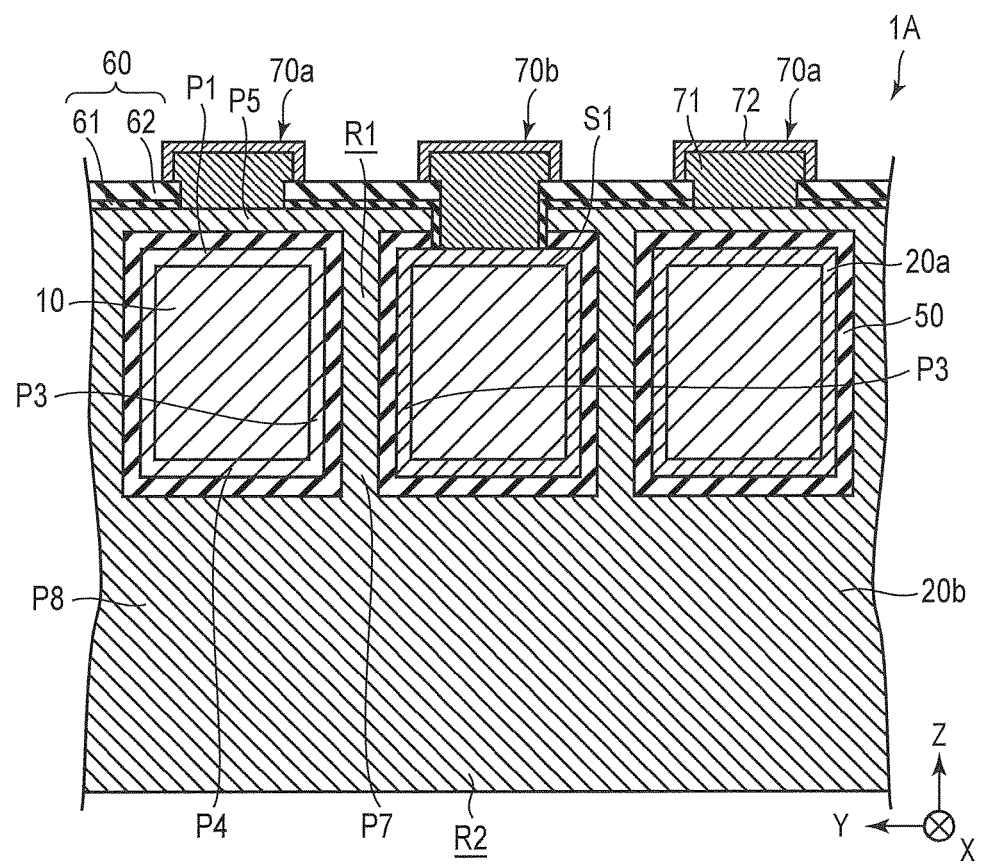
FIG. 4 is still another cross-sectional view of the capacitor shown in FIG. 1.
Figure 5:
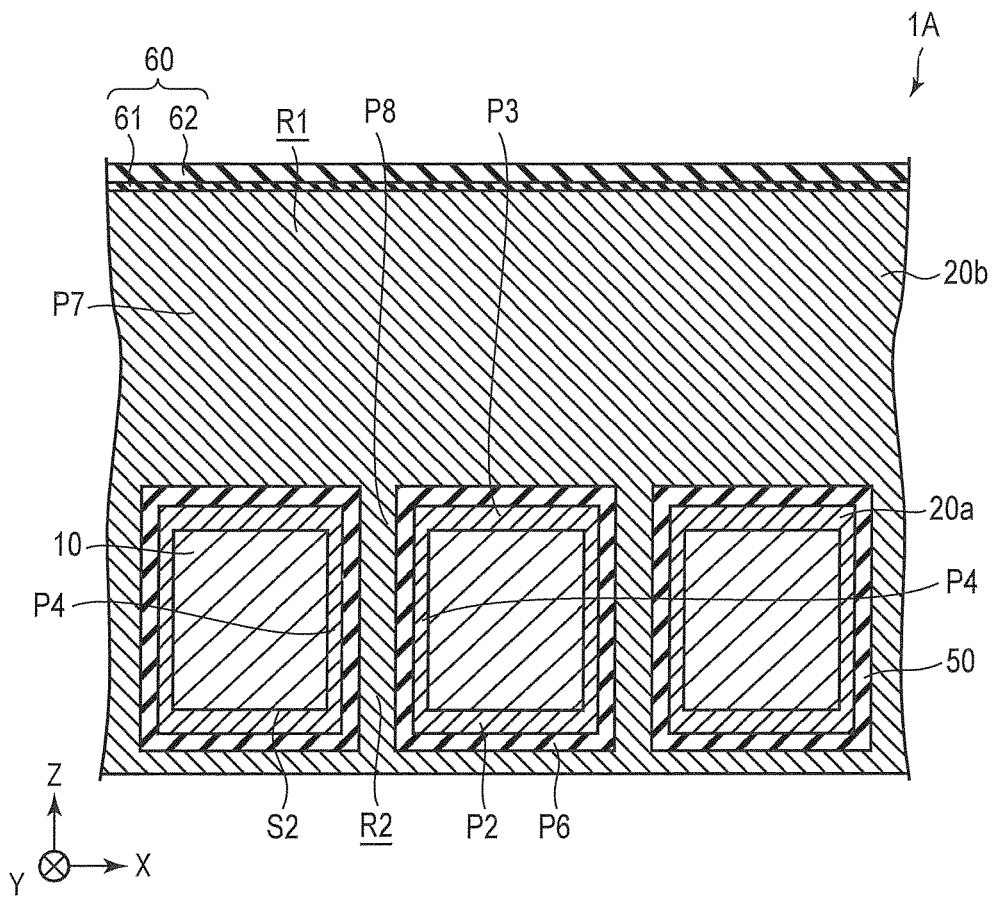
FIG. 5 is still another cross-sectional view of the capacitor shown in FIG. 1.
Figure 6:
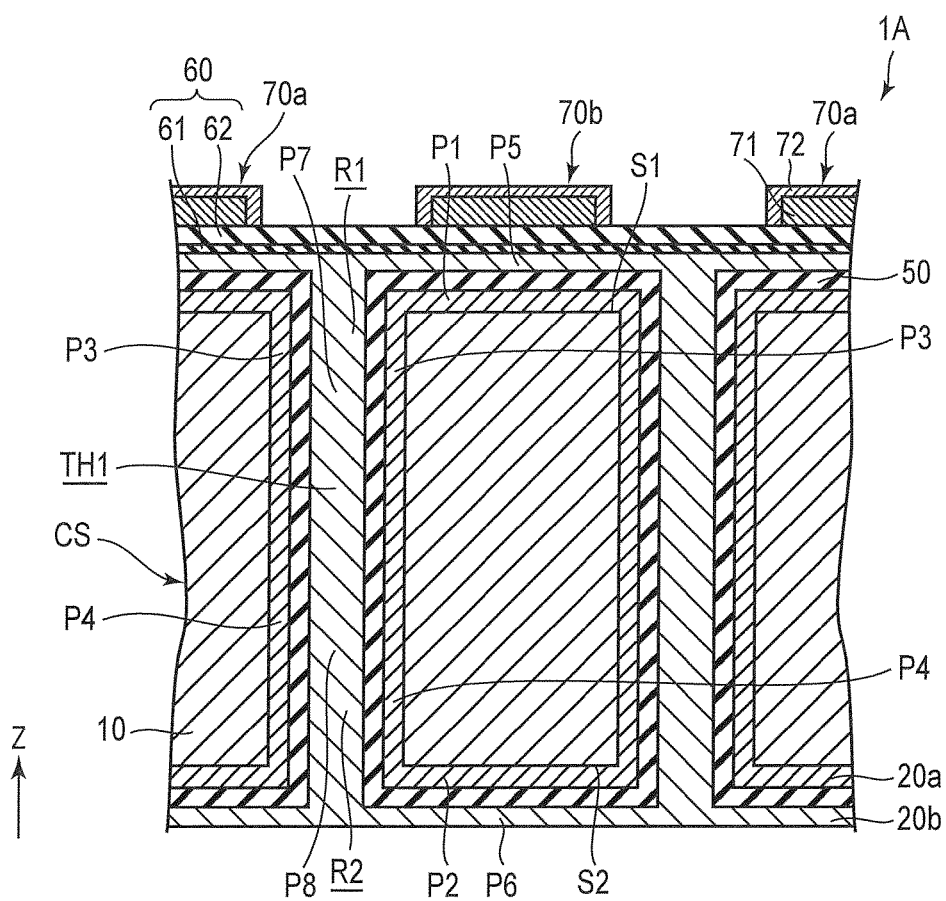
FIG. 6 is still another cross-sectional view of the capacitor shown in FIG. 1.

FIG. 1 is a plan view schematically showing a capacitor according to a first embodiment. FIG. 2 is a cross-sectional view taken along a line II-II of the capacitor shown in FIG. 1. FIG. 3 is a cross-sectional view taken along a line of the capacitor shown in FIG. 1. FIG. 4 is a cross-sectional view taken along a line IV-IV of the capacitor shown in FIG. 1. FIG. 5 is a cross-sectional view taken along a line V-V of the capacitor shown in FIG. 1. FIG. 6 is a cross-sectional view taken along a line VI-VI of the capacitor shown in FIG. 1.

A capacitor 1A shown in FIGS. 1 to 6 includes a substrate 10, a first conductive layer 20a, a second conductive layer 20b, and a dielectric layer 50, as shown in FIGS. 2 to 6.

In each figure, an X direction is a direction parallel to a main surface of the substrate 10, and a Y direction is a direction parallel to the main surface of the substrate 10 and perpendicular to the X direction. A Z direction is a thickness direction of the substrate 10, that is, a direction perpendicular to the X direction and the Y direction.

The substrate 10 is, for example, an insulating substrate, a semiconductor substrate, or a conductive substrate. The substrate 10 is preferably a semiconductor substrate. The substrate 10 is preferably a substrate containing silicon, such as a silicon substrate. Such a substrate can be processed using a semiconductor process.

As shown in FIGS. 2 to 6, the substrate 10 has a first main surface S1, and a second main surface S2 which is a back surface of the first main surface S1. Herein, the first main surface S1 and the second main surface S2 are a first surface and a second surface, respectively.

The first main surface S1 is provided with first recesses R1 shown in FIGS. 1, 2, and 4 to 6. Herein, the first recesses R1 are first trenches each having a shape extending in the X direction. The first recesses R1 are arranged in the Y direction as shown in FIGS. 1, 2, and 4. A plurality of first recesses R1 may be provided on the first main surface S1, or only one first recess R1 may be provided.

The second main surface S2 is provided with second recesses R2 shown in FIGS. 1, 3, and 4 to 6. Herein, these second recesses R2 are second trenches each having a shape extending in the Y direction. The second recesses R2 are arranged in the X direction as shown in FIGS. 1, 3, and 5.

A plurality of second recesses R2 may be provided on the second main surface S2, or only one second recess R2 may be provided.

A length direction of the first recesses R1 and a length direction of the second recesses R2 intersect each other. Herein, the length direction of the first recesses R1 and the length direction of the second recesses R2 are orthogonal to each other. The length direction of the first recesses R1 and the length direction of the second recesses R2 may intersect diagonally.

The "length direction" of the first or second recesses is a length direction of orthogonal projections of the first or second recesses onto a plane perpendicular to the thickness direction of the substrate 10. Accordingly, the fact that the length direction of the first recesses R1 and the length direction of the second recesses R2 intersect each other means that the length direction of the orthogonal projections of the first recesses onto the plane perpendicular to the thickness direction of the substrate 10 intersects the length direction of the orthogonal projections of the second recesses onto this plane.

A sum of a depth D1 of the first recesses R1 and a depth D2 of the second recesses R2, D1+D2, is equal to or greater than a thickness T of the substrate 10. If this configuration is adopted, the first recesses R1 and the second recesses R2 are connected to each other at positions where they intersect to form first through holes TH1 shown in FIG. 6.

A ratio between the sum D1+D2 and the thickness T, (D1+D2)/T, is preferably within a range of 1 to 1.4, and more preferably within a range of 1.1 to 1.3. From the viewpoint of increasing the electric capacity, the ratio (D1+D2)/T is preferably large. In addition, from the viewpoint of improving an electrical connection between portions of the first conductive layer 20a or the second conductive layer 20b that are located on side walls and bottom surfaces of the first recesses R1 and portions of the first conductive layer 20a or the second conductive layer 20b that are located on side walls and bottom surfaces of the second recess R2, it is preferable that the ratio (D1+D2)/T is large. However, when the depths D1 and D2 are increased, the mechanical strength of the capacitor LA decreases.

The ratio (D1+D2)/T may be less than 1. In this case, the first recesses R1 and the second recesses R2 do not form the first through holes TH1 shown in FIG. 6 at the positions where they intersect. Therefore, in this case, in addition to providing the first recesses R1 and the second recesses R2, the first through holes are provided at any positions of the substrate 10. In this case, either or both of the first recesses R1 and the second recesses R2 can be omitted.

It is preferable that a dimension of an opening of each of the first recess R1 and the second recess R2 is 0.3 μm or more. Note that the dimensions of the openings of the first recesses R1 and the second recesses R2 are diameters or widths of the openings of the first recesses R1 and the second recesses R2. Herein, the dimension of the opening of each of the first recesses R1 and the second recesses R2 is a dimension in a direction perpendicular to the length direction thereof. When these dimensions are reduced, a larger electrical capacity can be achieved. However, if these dimensions are reduced, it becomes difficult to form a stacked structure including the first conductive layer 20a, the dielectric layer 50, and the second conductive layer 20b in the first recesses R1 and the second recesses R2.

A distance between adjacent first recesses R1 and a distance between adjacent second recesses R2 are preferably 0.1 μm or more. When these distances are reduced, a larger electric capacity can be achieved. However, if these distances are reduced, a portion of the substrate 10 sandwiched between the first recesses R1 and a portion of the substrate 10 sandwiched between the second recesses R2 are likely to be damaged.

The first recesses R1 and the second recesses R2 can have various shapes. For example, the first recesses R1 and the second recesses R2 may have a curved or bent shape, and may be circular or square, as long as their orthogonal projections onto a plane perpendicular to the Z direction intersect each other.

Herein, cross sections of the first recesses R1 and the second recesses R2 parallel to the depth directions are rectangular. These cross sections may not be rectangular. For example, these cross sections may have a tapered shape.

The first through holes TH1 are arranged corresponding to intersections of the first recesses R1 and the second recesses R2. Each of the first through holes TH1 is constituted by a part of the first recess R1 and a part of the second recess R2. Each of the first through holes TH1 extends from the first main surface S1 to the second main surface S2. That is, each of the first through holes TH1 extends in the Z direction, which is the thickness direction of the substrate 10.

The first conductive layer 20a is provided on the substrate 10 as shown in FIGS. 2 to 6. The first conductive layer 20a and the substrate 10 constitute a conductive substrate CS.

The first conductive layer 20a is made of polysilicon doped with impurities to improve conductivity, or a metal or alloy such as nickel or copper. The first conductive layer 20a may have a single-layer structure or a multi-layer structure.

A thickness of the first conductive layer 20a is preferably within a range of 0.05 μm to 1 μm, and more preferably within a range of 0.1 μm to 0.3 μm. If the first conductive layer 20a is thin, there is a possibility that a discontinuous portion may be generated in the first conductive layer 20a, or a sheet resistance of the first conductive layer 20a may be excessively increased. When the first conductive layer 20a is thickened, it may be difficult to form a stacked structure of the first conductive layer 20a, the dielectric layer 50, and the second conductive layer 20b in the first recess R1 and the second recess R2.

The first conductive layer 20a includes a first portion P1 shown in FIGS. 2 to 4 and 6, a second portion P2 shown in FIGS. 2, 3, 5, and 6, third portions P3 shown in FIGS. 2 and 4 to 6, and fourth portions P4 shown in FIGS. 3 to 6. The first portion P1 is a portion of the first conductive layer 20a that is provided on the first main surface S1. The second portion P2 is a portion of the first conductive layer 20a that is provided on the second main surface S2. The third portions P3 are portions of the first conductive layer 20a that are provided on inner surfaces of the first recesses R1. The fourth portions P4 are portions of the first conductive layer 20a that are provided on inner surfaces of the second recesses R2.

That is, the first conductive layer 20a covers the first main surface S1, the second main surface S2, and the side walls of the first through holes TH1. Furthermore, the first conductive layer 20a covers the side walls and the bottom surfaces of the first recesses R1 and the side walls and the bottom surfaces of the second recesses R2.

The first part P1 and the third parts P3 are electrically connected together, as can be seen from FIGS. 2, 4, and 6. The second portion P2 and the fourth portions P4 are also electrically connected together, as can be seen from FIGS. 3, 5, and 6. The third portions P3 and the fourth portions P4 are electrically connected together at the positions of the first through holes TH1 shown in FIG. 6.

In the case where the substrate 10 is a semiconductor substrate, such as a silicon substrate, the first conductive layer 20a may be a high-concentration doped layer that is a surface region of the silicon substrate doped with impurities at a high concentration. When a conductivity of the silicon substrate itself is high, the first conductive layer 20a can be omitted. In this case, at least a surface region of the substrate 10, for example, the entire substrate 10 serves as the first conductive layer 20a.

The second conductive layer 20b faces the first conductive layer 20a with the dielectric layer 50 interposed therebetween. The second conductive layer 20b is made of polysilicon doped with impurities to improve the conductivity, or a metal or alloy such as nickel or copper. The second conductive layer 20b may have a single-layer structure or a multi-layer structure.

The thickness of the second conductive layer 20b is preferably within a range of 0.05 μm to 1 μm, and more preferably within a range of 0.1 μm to 0.3 μm. If the second conductive layer 20b is thin, there is a possibility that a discontinuous portion may be generated in the second conductive layer 20b, or a sheet resistance of the second conductive layer 20b may be excessively increased. If the second conductive layer 20b is thick, it may be difficult to form the first conductive layer 20a and the dielectric layer 50 with sufficient thicknesses.

The second conductive layer 20b includes a fifth portion P5 shown in FIGS. 2 to 4 and 6, a sixth portion P6 shown in FIGS. 2, 3, 5, and 6, seventh portions P7 shown in FIGS. 2 and 4 to 6, and eighth portions P8 shown in FIGS. 3 to 6. The fifth portion P5 is a portion of the second conductive layer 20b that faces the first main surface S1 with the first portion P1 interposed therebetween. The sixth portion P6 is a portion of the second conductive layer 20b that faces the second main surface S2 with the second portion P2 interposed therebetween. The seventh portions P7 are portions of the second conductive layer 20b that face the inner surfaces of the first recesses R1 with the third portions P3 interposed therebetween. The eighth portions P8 are portions of the second conductive layer 20b that face the inner surfaces of the second recesses R2 with the fourth portions P4 interposed therebetween.

That is, the second conductive layer 20b faces the first main surface S1, the second main surface S2, and the side walls of the first through holes TH1, with the first conductive layer 20a interposed therebetween. Furthermore, the second conductive layer 20b faces the side walls and the bottom surfaces of the first recesses R1 and the side walls and the bottom surfaces of the second recesses R2, with the first conductive layer 20a interposed therebetween.

The fifth portion P5 and the seventh portions P7 are electrically connected together, as can be seen from FIGS. 2, 4, and 6. The sixth portion P6 and the eighth portions P8 are also electrically connected together, as can be seen from FIGS. 3, 5, and 6. The seventh portions P7 and the eighth portions P8 are electrically connected together at the positions of the first through holes TH1 shown in FIG. 6.

In FIGS. 2 to 6, the second conductive layer 20b is provided so that the first recesses R1 and the second recesses R2 are completely filled with the first conductive layer 20a, the second conductive layer 20b, and the dielectric layer 50. The second conductive layer 20b may be a layer that is conformal to the first conductive layer 20a. That is, the second conductive layer 20b may be a layer having a substantially uniform thickness. In this case, the first recess R1 and the second recess R2 are not completely filled with the first conductive layer 20a, the second conductive layer 20b, and the dielectric layer 50.

The second conductive layer 20b is provided with a plurality of through holes. Herein, these through holes are provided in a portion of the second conductive layer 20b that faces the first main surface with the first conductive layer 20a and the dielectric layer 50 interposed therebetween, at positions corresponding to the intersections of the first recesses R1 and the second recesses R2. The second conductive layer 20b may be provided with through holes at other positions. Further, the second conductive layer 20b may be provided with only one through hole.

The dielectric layer 50 is interposed between the first conductive layer 20a and the second conductive layer 20b. The dielectric layer 50 is a layer that is conformal to the first conductive layer 20a. The dielectric layer 50 electrically insulates the first conductive layer 20a and the second conductive layer 20b from each other.

The dielectric layer 50 is made of, for example, an inorganic dielectric. As the inorganic dielectric, a ferroelectric can also be used. Paraelectrics, such as silicon nitride, silicon oxide, silicon oxynitride, titanium oxide, and tantalum oxide, are preferable. These paraelectrics have a small change in dielectric constant with temperature. Therefore, when the paraelectrics are used for the dielectric layer 50, the heat resistance of the capacitor 1A can be improved.

A thickness of the dielectric layer 50 is preferably within a range of 0.005 μm to 0.5 μm, and more preferably within a range of 0.01 μm to 0.1 μm. When the dielectric layer 50 is thin, there is a possibility that a discontinuous portion may be generated in the dielectric layer 50, and the first conductive layer 20a and the second conductive layer 20b may be short-circuited. Further, if the dielectric layer 50 is thinned, a withstand voltage is lowered even if there is no short circuit, and a possibility of short-circuiting when a voltage is applied is increased. When the dielectric layer 50 is thickened, the withstand voltage increases, but the electric capacity decreases.

The dielectric layer 50 is provided with a plurality of through holes. The through holes of the dielectric layer 50 are connected to the through holes of the second conductive layer 20b.

The capacitor 1A further includes an insulating layer 60 shown in FIGS. 1 to 6, electrodes 70a and 70b shown in FIGS. 1, 2, 4, and 6, and pads 70c and 70d shown in FIG. 1.

The insulating layer 60 faces the first main surface S1 with a part of the first conductive layer 20a, a part of the second conductive layer 20b, and a part of the dielectric layer 50, interposed therebetween. Specifically, the insulating layer 60 covers the fifth portion P5 and the seventh portion P7 of the second conductive layer 20b.

The insulating layer 60 includes a first insulating layer 61 and a second insulating layer 62.

The first insulating layer 61 covers the fifth portion P5 and the seventh portion P7 of the second conductive layer 20b. The first insulating layer 61 further covers the side walls of the through holes provided in the second conductive layer 20b and the side walls of the through holes provided in the dielectric layer 50. The first insulating layer 61 is made of, for example, an inorganic insulator such as silicon nitride.

The second insulating layer 62 covers the first insulating layer 61. The second insulating layer 62 is made of, for example, an organic insulator such as polyimide.

The insulating layer 60 may have a multi-layer structure or a single-layer structure.

The insulating layer 60 is provided with a plurality of through holes. Some of these through holes are connected to the through holes provided in the dielectric layer 50 via the through holes provided in the second conductive layer 20b, and together with them, form first contact holes. The rest of the through holes provided in the insulating layer 60 are provided at an intermediate position between the first contact holes adjacent in the Y direction to form second contact holes.

The electrode 70a is provided on the insulating layer 60. The electrode 70a is a comb-shaped electrode. The electrode 70a has comb tooth portions each extending in the X direction and arranged in the Y direction. The comb tooth portions of the electrode 70b and the comb tooth portions of the electrode 70a are alternately arrayed in the Y direction. Herein, the electrode 70a is a second electrode. The electrode 70a fills the second contact holes. The electrode 70a is electrically connected to the second conductive layer 20b. The electrode 70a is the comb-shaped electrode herein, but the electrode 70a may have other shapes.

The electrode 70b is provided on the insulating layer 60. The electrode 70b is a comb-shaped electrode. The electrode 70b has comb tooth portions each extending in the X direction and arranged in the Y direction. Herein, the electrode 70b is a first electrode. The electrode 70b fills the first contact holes. The electrode 70b is electrically connected to the first conductive layer 20a. The electrode 70b is the comb-shaped electrode herein, but the electrode 70b may have other shapes.

The pad 70c is provided on the insulating layer 60. The pad 70c is electrically connected to the electrode 70a.

The pad 70d is provided on the insulating layer 60. The pad 70d is electrically connected to the electrode 70b.

The electrodes 70a and 70b and the pads 70c and 70d have a stacked structure including a barrier layer (not shown), a first metal layer 71, and a second metal layer 72. The barrier layer is made of, for example, titanium. The first metal layer 71 is provided on the barrier layer. The first metal layer 71 is made of, for example, copper. The second metal layer 72 covers an upper surface and an end surface of the first metal layer 71. The second metal layer 72 is constituted of, for example, a stacked film of a nickel or nickel alloy layer and a gold layer. The barrier layer and the second metal layer 72 can be omitted.

This capacitor 1A is manufactured by, for example, the following method.

Figure 7:
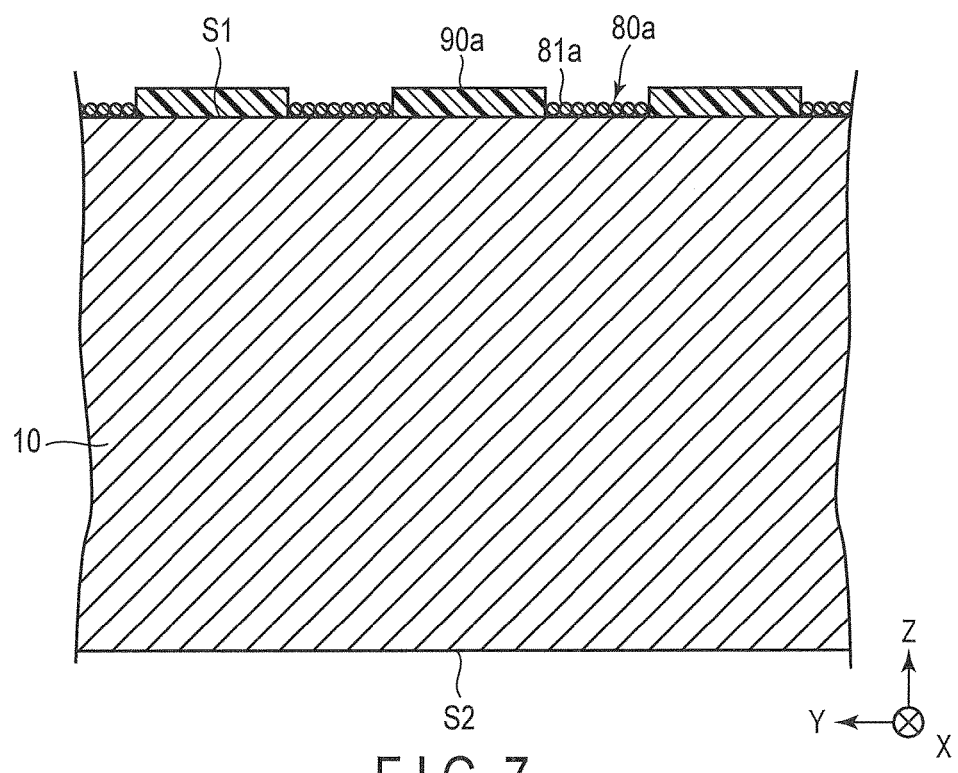
FIG. 7 is a cross-sectional view schematically showing one process in the manufacture of the capacitor shown in FIGS. 1 to 6.
Figure 8:
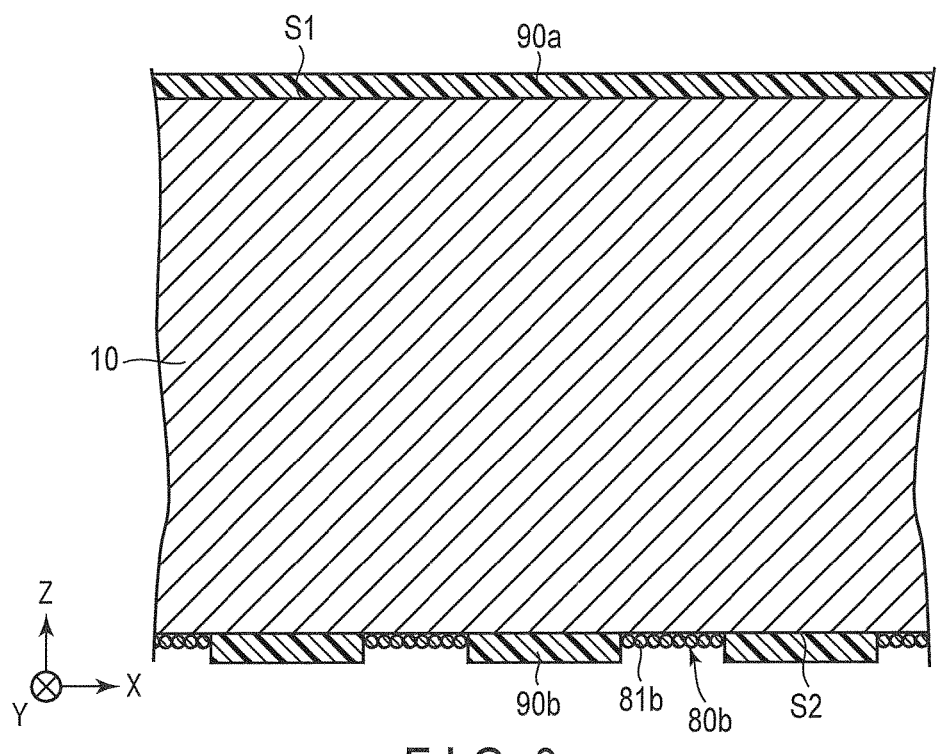
FIG. 8 is a cross-sectional view schematically showing another process in the manufacture of the capacitor shown in FIGS. 1 to 6.

FIG. 7 is a cross-sectional view schematically showing a first step of forming a catalyst layer in the manufacture of the capacitor shown in FIGS. 1 to 6. FIG. 8 is a cross-sectional view schematically showing a second step of forming a catalyst layer in the manufacture of the capacitor shown in FIGS. 1 to 6. FIG. 9 is a cross-sectional view schematically showing an etching step in the manufacture of the capacitor shown in FIGS. 1 to 6. FIG. 10 is another cross-sectional view schematically showing the etching step in the manufacture of the capacitor shown in FIGS. 1 to 6. FIG. 11 is a cross-sectional view schematically showing an example of a structure obtained by the etching step of FIGS. 9 and 10. FIG. 12 is another cross-sectional view of the structure shown in FIG. 11.

In this method, first, the substrate 10 shown in FIG. 7 is prepared. Herein, as an example, the substrate 10 is assumed to be a single-crystal silicon wafer. A plane orientation of the single-crystal silicon wafer is not particularly limited. In this example, a silicon wafer whose first main surface S1 is a (100) plane is used. As the substrate 10, a silicon wafer whose first main surface S1 is a (110) plane can also be used.

Next, the first through hole TH1 is formed on the substrate 10 by MacEtch (Metal-Assisted Chemical Etching).

That is, as shown in FIGS. 7 and 8, first catalyst layers 80a and 80b containing a first noble metal are first formed on the substrate 10. The first catalyst layers 80a and 80b are formed so as to partially cover the first main surface S1 and the second main surface S2, respectively.

Specifically, a first mask layer 90a is first formed on the first main surface S1 of the substrate 10.

The first mask layer 90a is opened at positions corresponding to the first recesses R1. The first mask layer 90a prevents a portion of the first main surface S1 that is covered with the first mask layer 90a, from coming into contact with a noble metal to be described later.

Examples of the material of the first mask layer 90a include organic materials such as polyimide, fluororesin, phenol resin, acrylic resin, and novolac resin, and inorganic materials such as silicon oxide and silicon nitride.

The first mask layer 90a can be formed by, for example, existing semiconductor processes. The first mask layer 90a made of an organic material can be formed by, for example, photolithography. The first mask layer 90a made of an inorganic material can be formed by, for example, deposition of an inorganic material layer by vapor deposition, formation of a mask by photolithography, and patterning of the inorganic material layer by etching. Alternatively, the first mask layer 90a made of an inorganic material can be formed by oxidation or nitriding of the surface region of the substrate 10, formation of a mask by photolithography, and patterning of an oxide or nitride layer by etching. The first mask layer 90a can be omitted.

Next, the catalyst layer 80a is formed on each of the regions of the first main surface S1 that are not covered with the first mask layer 90a. The catalyst layer 80a is, for example, a discontinuous layer containing a noble metal. Herein, as an example, it is assumed that the catalyst layer 80a is a particulate layer made of catalyst particles 81a containing a noble metal.

The noble metal is, for example, one or more of gold, silver, platinum, rhodium, palladium, and ruthenium. The catalyst layer 80a and the catalyst particles 81a may further contain a metal other than a noble metal, such as titanium.

The catalyst layer 80a can be formed by, for example, electroplating, reduction plating, or displacement plating. The catalyst layer 80a can also be formed by application of a dispersion containing noble metal particles, or vapor deposition such as evaporation or sputtering. Of these methods, the displacement plating is particularly favorable because it is possible to directly and evenly deposit a noble metal on regions of the first main surface S1 that are not covered with the first mask layer 90a.

Next, as shown in FIG. 8, a second mask layer 90b is formed on the second main surface S2 of the substrate 10.

The second mask layer 90b is opened at positions corresponding to the second recesses R2. The second mask layer 90b prevents a portion of the second main surface S2 that is covered with the second mask layer 90b, from coming into contact with the noble metal.

As the material of the second mask layer 90b, for example, those exemplified for the first mask layer 90a can be used. The second mask layer 90b can be formed, for example, by the same method as described above for the first mask layer 90a.

Next, a catalyst layer 80b is formed on each of the regions of the second main surface S2 that are not covered with the second mask layer 90b. The catalyst layer 80b is, for example, a discontinuous layer containing a noble metal. Herein, as an example, the catalyst layer 80b is assumed to be a particulate layer made of catalyst particles 81b containing a noble metal.

As materials for the catalyst layer 80b and the catalyst particles 81b, for example, those exemplified for the catalyst layer 80a and the catalyst particles 81a can be used. The catalyst layer 80b can be formed, for example, by the same method as described above for the catalyst layer 80a.

It is possible that after forming the first mask layer 90a on the first main surface S1, the second mask layer 90b is formed on the second main surface S2, and subsequently, the catalyst layer 80a and the catalyst particles 81a are formed, and then the catalyst layer 80b and the catalyst particles 81b is formed. It is also possible that after forming the first mask layer 90a on the first main surface S1, the second mask layer 90b is formed on the second main surface S2, and after that, the substrate is immersed in a plating solution so that the catalyst layer 80a and the catalyst particles 81a, and the catalyst layer 80b and the catalyst particles 81b, are formed at the same time.

Next, the substrate 10 is etched with an assist from the noble metal as a catalyst to form the first through holes TH1 shown in FIG. 6 in the substrate 10.

Specifically, as shown in FIGS. 9 and 10, the substrate 10 is etched with an etching agent 100. For example, the substrate 10 is immersed in the etching agent 100 in liquid form to bring the etching agent 100 into contact with the substrate 10.

The etching agent 100 contains an oxidizing agent and hydrogen fluoride.

The concentration of hydrogen fluoride in the etching agent 100 is preferably within a range of 1 mol/L to 20 mol/L, more preferably within a range of 5 mol/L to 10 mol/L, and further preferably within a range of 3 mol/L to 7 mol/L. When the hydrogen fluoride concentration is low, it is difficult to achieve a high etching rate. When the hydrogen fluoride concentration is high, excessive side etching may occur.

The oxidizer can be selected from, for example, hydrogen peroxide, nitric acid, $AgNO_3$, $KAuCl_4$, $HAuCl_4$, $K_2PtCl_6$, $H_2PtCl_6$, $Fe(NO_3)_3$, $Ni(NO_3)_2$, $Mg(NO_3)_2$, $Na_2S_2O_8$, $K_2S_2O_8$, $KMnO_4$, and $K_2Cr_2O_7$. Hydrogen peroxide is favorable as the oxidizer because no harmful byproduct is produced and a semiconductor element is not contaminated.

The concentration of the oxidizer in the etching agent 100 is preferably within a range of 0.2 mol/L to 8 mol/L, more preferably within a range of 2 mol/L to 4 mol/L, and further preferably within a range of 3 mol/L to 4 mol/L.

The etching agent 100 may further contain a buffer. The buffer contains, for example, at least one of ammonium fluoride and ammonia. As an example, the buffer is ammonium fluoride. As another example, the buffer is a mixture of ammonium fluoride and ammonia.

The etching agent 100 may further contain other components such as water.

When such an etching agent 100 is used, the material of the substrate 10, silicon herein, is oxidized only in regions of the substrate 10 that are close to the first catalyst particles 81a or the second catalyst particles 82b. Oxide generated thereby is dissolved and removed by hydrofluoric acid. Therefore, only the portions close to the first catalyst particles 81a or the second catalyst particles 82b are selectively etched.

The first catalyst particles 81a move toward the second main surface S2 with the progress of etching, where etching similar to the above is performed. As a result, as shown in FIG. 9, at the position of the first catalyst layer 80a, etching proceeds from the first main surface S1 toward the second main surface S2 in a direction perpendicular to the first main surface S1.

On the other hand, the second catalyst particles 81b move toward the first main surface S1 with the progress of etching, where etching similar to the above is performed. As a result, as shown in FIG. 10, at the position of the second catalyst layer 80b, etching proceeds from the second main surface S2 toward the first main surface S1 in a direction perpendicular to the second main surface S2.

In this way, as shown in FIGS. 11 and 12, the first recesses R1 are formed on the first main surface S1, and the second recesses R2 are formed on the second main surface S2. When the sum D1+D2 of the depth D1 of the first recesses R1 and the depth D2 of the second recesses R2 is equal to or greater than the thickness T of the substrate 10, the first recesses R1 and the second recesses R2 are connected together at positions where they intersect to form the first through holes TH1 shown in FIG. 6.

Thereafter, the first mask layer 90a and the second mask layer 90b, and the catalyst layers 80a and 80b, are removed from the substrate 10. One or more of the first mask layer 90a, the second mask layer 90b, and the catalyst layers 80a and 80b may not be removed from the substrate 10.

Next, the first conductive layer 20a shown in FIGS. 2 to 6 is formed on the substrate 10. In the case where the first conductive layer 20a is made of polysilicon, such a layer can be formed by, for example, LPCVD (low pressure chemical vapor deposition). In the case where the first conductive layer 20a is made of metal, such a layer can be formed by, for example, electrolytic plating, reduction plating, or displacement plating.

A plating solution is a liquid containing a salt of a metal to be plated. As the plating solution, a general plating solution, such as a copper sulfate plating solution containing copper sulfate pentahydrate and sulfuric acid, a copper pyrophosphate plating solution containing copper pyrophosphate and potassium pyrophosphate, and a nickel sulfamate plating solution containing nickel sulfamate and boron, can be used.

The first conductive layer 20a is preferably formed by a plating method using a plating solution containing a salt of a metal to be plated, a surfactant, and carbon dioxide in a supercritical or subcritical state. In this plating method, the surfactant is interposed between particles made of supercritical carbon dioxide and a continuous phase of a solution containing a salt of the metal to be plated. That is, the surfactant is allowed to form micelles in the plating solution, and supercritical carbon dioxide is incorporated in these micelles.

In a normal plating method, the supply of the metal to be plated may be insufficient in the vicinity of the bottoms of the first recesses R1 and the second recesses R2. This is particularly noticeable when the ratio D1/W1 of the depth D1 to the width or diameter W1 of the first recess R1, or the ratio D2/W2 of the depth D2 to the width or diameter W2 of the second recess R2, is large.

The micelles incorporating supercritical carbon dioxide can easily enter narrow gaps. As the micelles move, the solution containing the salt of the metal to be plated also moves. Therefore, according to a plating method using a plating solution containing a salt of a metal to be plated, a surfactant, and carbon dioxide in a supercritical or subcritical state, the first conductive layer 20a having a uniform thickness can be easily formed.

Next, the dielectric layer 50 is formed on the first conductive layer 20a. The dielectric layer 50 can be formed by, for example, CVD (chemical vapor deposition). Alternatively, the dielectric layer 50 can be formed by oxidizing, nitriding, or oxynitriding the surface of the first conductive layer 20a.

Next, the second conductive layer 20b is formed on the dielectric layer 50. The second conductive layer 20b can be formed, for example, by the same method as described above for the first conductive layer 20a. The second conductive layer 20b is also preferably formed by a plating method using a plating solution containing a salt of a metal to be plated, a surfactant, and carbon dioxide in a supercritical or subcritical state.

Next, a plurality of through holes are formed in a stacked body including the second conductive layer 20b and the dielectric layer 50. Herein, these through holes are formed in a portion of the stacked body that faces the first main surface with the first conductive layer 20a interposed therebetween, at positions corresponding to intersections of the first recesses R1 and the second recesses R2. These through holes can be formed by, for example, formation of a mask by photolithography and patterning by etching.

Next, the first insulating layer 61 is formed on the fifth portion P5 and the seventh portion P7 of the second conductive layer 20b. The first insulating layer 61 can be formed by, for example, CVD.

Thereafter, the second insulating layer 62 is formed on the first insulating layer 61. The second insulating layer 62 is provided with through holes at the positions of the through holes provided in the above stacked body. When a photosensitive resin is used as the material of the second insulating layer 62, the second insulating layer 62 having the through holes can be obtained using photolithography.

Next, the first insulating layer 61 is etched using the second insulating layer 62 as an etching mask. As a result, a portion of the first insulating layer 61 that covers the first conductive layer 20a is removed.

Next, the first metal layer 71 and the second metal layer 72 are formed in this order. The first metal layer 71 and the second metal layer 72 can be formed by, for example, a combination of film formation by sputtering or plating, and photolithography.

In this capacitor 1A, the stacked structure including the first conductive layer 20a, the dielectric layer 50, and the second conductive layer 20b is provided not only on the first main surface S1, but also on the second main surface S2 and in the first through holes TH1. Therefore, this capacitor 1A can achieve a large electric capacity.

In the capacitor 1A, the first recesses R1 and the second recesses R2 are trenches. The above stacked structure is also provided on the side walls and the bottom surfaces of the trenches. Therefore, this capacitor 1A can achieve a particularly large electric capacity.

For example, when the first recesses R1 and the second recesses R2 have a depth of 100 μm and a width of 1 μm, a distance between adjacent first recesses R1 and a distance between adjacent second recesses R2 are both 1 μm, and a silicon oxide film having a thickness of 0.02 μm is used as the dielectric layer 50, if the thickness of the capacitor 1A is assumed to be about 0.2 mm, a capacitance density of about 650 $nF/mm^2$ can be achieved.

In the capacitor 1A, the first recesses R1 and the second recesses R2 intersect each other, and the sum D1+D2 of their depths is equal to or greater than the thickness T of the substrate 10. Therefore, when the first recesses R1 and the second recesses R2 are formed, the first through holes TH1 are generated at the positions where they intersect. That is, unlike the case where the first recess R1 and the second recess R2 are merely formed on the first main surface S1 and the second main surface S2, respectively, such that the sum D1+D2 is smaller than the thickness T, if the step of forming the first recess R1 and the second recess R2 is performed, there is no need to perform a step of forming the first through holes TH1.

Further, in this capacitor 1A, electrical connection between a portion of the above stacked structure located on the first main surface S1 and a portion of the above stacked structure located on the second main surface S2 is performed using the first through holes TH1. Therefore, both electrodes 70a and 70b can be disposed on one side of the capacitor 1A. That is, unlike the case where the first recess R1 and the second recess R2 are merely formed on the first main surface S1 and the second main surface S2, respectively, such that the sum D1+D2 is smaller than the thickness T, it is not necessary to form the electrodes 70a and 70b and wirings similar thereto on the second main surface S2, thus the number of steps can be greatly reduced. Furthermore, the capacitor 1A employing such a configuration can be easily mounted on a wiring board, etc.

Second Embodiment

FIG. 13 is a cross-sectional view schematically showing a capacitor according to a second embodiment.

A capacitor 1B shown in FIG. 13 is the same as the capacitor 1A according to the first embodiment except that the following configuration is adopted.

That is, the capacitor 1B includes a first dielectric layer 50a instead of the dielectric layer 50. The first dielectric layer 50a is the same as the dielectric layer 50 of the capacitor 1A according to the first embodiment.

In the capacitor 1B, the second conductive layer 20b is a layer that is conformal to the first conductive layer 20a.

The capacitor 1B further includes a second dielectric layer 50b and a third conductive layer 20c.

The second dielectric layer 50b is provided on the second conductive layer 20b. The second dielectric layer 50b is a layer that is conformal to the first conductive layer 20a. For the second dielectric layer 50b, for example, the same configuration as that of the first dielectric layer 50a can be adopted.

The third conductive layer 20c is provided on the second dielectric layer 50b. For the third conductive layer 20c, for example, a configuration similar to that of the second conductive layer 20b can be adopted.

Further, in this capacitor 1B, the electrodes 70a and 70b and the pads 70c and 70d shown in FIG. 1 are formed of a stacked body that includes a third metal layer 73 in addition to the first metal layer 71 and the second metal layer 72. For the third metal layer 73, for example, the same configuration as that of the first metal layer 71 can be adopted.

In addition, in this capacitor 1B, the electrode 70a is not in contact with the second conductive layer 20b, parts of comb tooth portions of the electrode 70a are in contact with the first conductive layer 20a, and other parts of the comb tooth portions are in contact with the third conductive layer 20c. That is, the first conductive layer 20a and the third conductive layer 20c are electrically connected to each other. In this capacitor 1B, the electrode 70b is not in contact with the first conductive layer 20a and the third conductive layer 20c, and comb tooth portions of the electrode 70b are in contact with the second conductive layer 20b. That is, in this capacitor 1B, the electrode 70a is a first electrode, and the electrode 70b is a second electrode.

This capacitor 1B has the same effect as described above for the capacitor 1A.

In addition, in the capacitor 1B, the first conductive layer 20a, the first dielectric layer 50a, the second conductive layer 20b, the second dielectric layer 50b, and the third conductive layer 20c form a stacked structure. That is, in this capacitor 1B, as compared with the capacitor 1A, more conductive layers are stacked with a dielectric layer interposed therebetween. Therefore, this capacitor 1B can achieve a larger electric capacity.

For example, when the first recesses R1 and the second recesses R2 have a depth of 100 μm and a width of 1 μm, a distance between adjacent first recesses R1 and a distance between adjacent second recesses R2 are both 1 μm, and a silicon oxide film having a thickness of 0.02 μm is used as the first dielectric layer 50a and the second dielectric layer 50b, if a thickness of the capacitor 1B is assumed to be about 0.2 mm, a capacitance density of about 1300 nF/mm$^2$ can be achieved.

Third Embodiment

Figure 14:
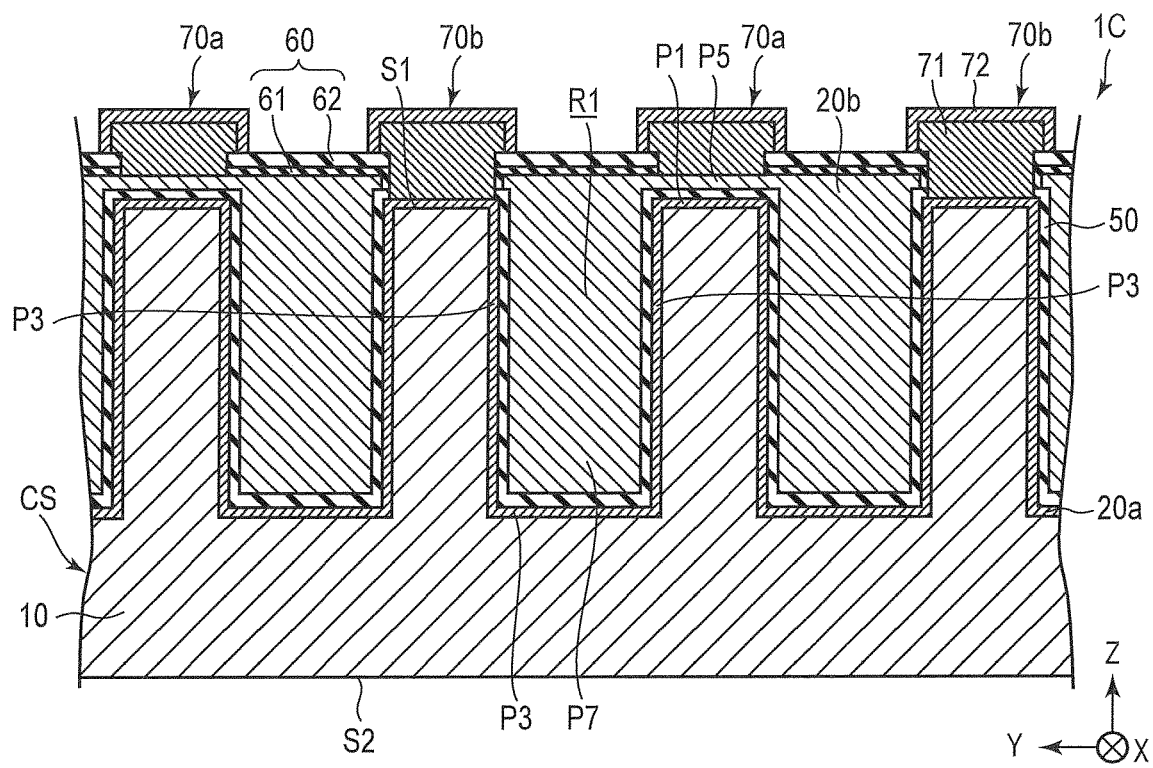
FIG. 14 is a cross-sectional view schematically showing a capacitor according to a third embodiment.
Figure 15:
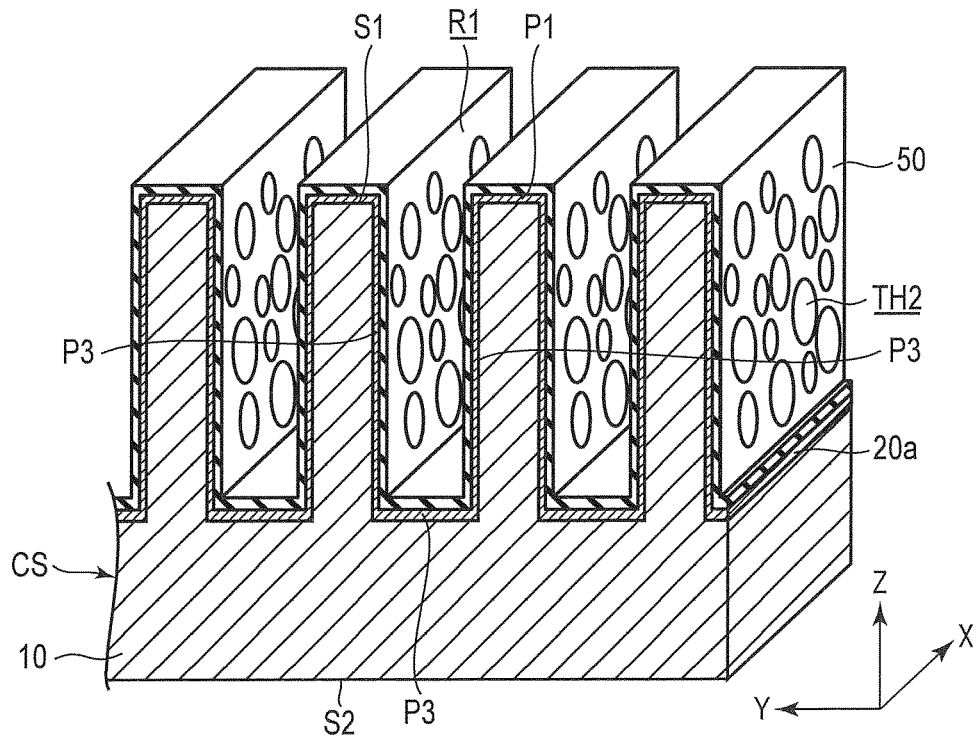
FIG. 15 is a perspective view schematically showing a part of the capacitor shown in FIG. 14.

FIG. 14 is a cross-sectional view schematically showing a capacitor according to a third embodiment. FIG. 15 is a perspective view schematically showing a part of the capacitor shown in FIG. 14. FIG. 15 illustrates a structure in which the electrode 70b, the electrode 70a, the insulating layer 60, and the second conductive layer 20b are omitted from the capacitor 1C illustrated in FIG. 14.

The capacitor 1C shown in FIG. 14 is the same as the capacitor 1A according to the first embodiment except that the following configuration is adopted.

That is, in this capacitor 1C, the second recesses R2 are omitted. That is, the capacitor 1C does not have the first through holes TH1 shown in FIG. 6.

Instead, in this capacitor 1C, as shown in FIG. 15, one or more portions of the substrate 10 each sandwiched between two adjacent ones of the first recesses R1 are provided with one or more second through holes TH2 that connect one of the two adjacent first recesses R1 and the other. That is, in this capacitor 1C, a side wall of the one of the two adjacent first recesses R1 corresponds to a first surface, and a side wall of the other one of the two adjacent first recesses R1 corresponds to a second surface.

In the capacitor 1C, the stacked structure including the first conductive layer 20a, the dielectric layer 50, and the second conductive layer 20b is provided not only on the first main surface S1 and the side walls and the bottom surfaces of the first recesses R1, but also on the side walls of the second through holes TH2. That is, the first conductive layer 20a further covers the side walls of the second through holes TH2 in addition to the first main surface S1 and the side walls and the bottom surfaces of the first recesses R1. The second conductive layer 20b faces the side walls of the second through holes TH2 in addition to facing the first main surface S1 and the side walls and the bottom surfaces of the first recesses R1, with the first conductive layer 20a interposed therebetween.

An average diameter of the second through holes TH2 is preferably 0.3 μm or more. When the diameter of the second through holes TH2 is reduced, a larger number of second through holes TH2 can be disposed, and thus a larger electric capacity can be achieved. However, if the diameter of the second through holes TH2 is reduced too much, there is a possibility that it may be difficult to form the stacked structure of the first conductive layer 20a, the dielectric layer 50, and the second conductive layer 20b in the second through holes TH2.

A proportion of a total area of openings of the second through holes TH2 in an area of a side wall of the first recess R1, which is hereinafter referred to as an aperture ratio, is preferably within a range of 30% to 90%, and more preferably within a range of 50% to 90%. A ratio of the number of the second through holes TH2 provided on a side wall of the first recess R1 to an area of the side wall, which is hereinafter referred to as a hole density, is preferably within a range of 0.4/μm² to 20/μm², and more preferably within a range of 2/μm² to 8/μm².

When the aperture ratio and the hole density are increased, a larger electric capacity can be achieved. However, if the aperture ratio and the hole density are excessively increased, there is a possibility that it may be difficult to form the stacked structure of the first conductive layer 20a, the dielectric layer 50, and the second conductive layer 20b in the second through holes TH2.

A distance between adjacent first recesses R1 is preferably 0.1 μm or more, and more preferably 2 μm or more. When this distance is increased, a larger electric capacity can be achieved. However, since a rate of increase in electric capacity with respect to this distance gradually decreases as the distance increases, it is not effective to excessively increase the above distance. If this distance is increased, there is a possibility that it may be difficult to form the stacked structure of the first conductive layer 20a, the dielectric layer 50, and the second conductive layer 20b in the second through holes TH2.

The capacitor 1C is manufactured, for example, by the following method.

FIG. 16 is a perspective view schematically showing an example of a substrate provided with trenches, used for manufacture of the capacitor shown in FIG. 14. FIG. 17 is a perspective view schematically showing a catalyst layer forming step in the manufacture of the capacitor shown in FIG. 14. FIG. 18 is a perspective view schematically showing an example of a structure obtained by an etching step in the manufacture of the capacitor shown in FIG. 14.

In this method, first, as shown in FIG. 16, the substrate 10 provided with a plurality of first recesses R1 on the first main surface S1 is prepared. The first recesses R1 are, for example, formed by the MacEtch described with reference to FIGS. 7 to 12.

Next, the second through holes TH2 are formed on the substrate 10 by the MacEch.

That is, first, as shown in FIG. 17, the catalyst particles 81a are deposited on the side walls of the first recesses R1. The catalyst particles 81a are deposited such that sufficiently large gaps are generated between the catalyst particles 81a.

The catalyst particles 81a may be deposited on the bottom surfaces of the first recesses R1 and the first main surface, but do not necessarily have to be deposited thereon. Therefore, prior to the deposition of the catalyst particles 81a, a mask layer (not shown) may be formed so as to cover the bottom surfaces of the first recesses R1 and the first main surface.

Next, the substrate 10 is etched with an assist from the noble metal as a catalyst to form the second through holes TH2 shown in FIG. 18 on the substrate 10. Specifically, the substrate 10 is etched with an etching agent. For example, the substrate 10 is immersed in a liquid etching agent, and the etching agent is brought into contact with the substrate 10. As the etching agent, those described in the first embodiment can be used.

Since the catalyst particles 81a are deposited such that sufficiently large gaps are generated between them, a plurality of recesses are formed on the side walls of the first recesses R1. These recesses increase in depth with the progress of etching, and finally become the second through holes TH2. As described above, the structure shown in FIG. 18 is obtained.

If the stacked structure of the first conductive layer 20a, the dielectric layer 50, and the second conductive layer 20b is then be formed inside the recesses formed on the side walls of the first recesses R1 to cover the side walls of the former recesses, this stacked structure constitutes a capacitor in each of the recesses formed on the side walls of the first recesses R1. Therefore, one or more of the recesses formed on the side walls of the first recesses R1 need not be through holes.

Thereafter, the first conductive layer 20a, the dielectric layer 50, the second conductive layer 20b, the insulating layer 60, the electrodes 70a and 70b, etc. are formed by the same method as described in the first embodiment. In this way, the capacitor 1C is obtained.

In the capacitor 1C, the first recesses R1 are provided, and the second through holes TH2 are provided on the side walls of the first recesses R1. The stacked structure of the first conductive layer 20a, the dielectric layer 50, and the second conductive layer 20b is provided not only on the first main surface S1 and the side walls and the bottom surfaces of the first recesses R1, but also on the side walls of the second through holes TH2. Therefore, the capacitor 1C can achieve a large electric capacity.

For example, when a depth of the first recesses R1 is 100 μm, a width is 1 μm, a distance between adjacent first recesses R1 is 1 μm, an aperture ratio on the side walls of the first recesses R1 is 300, a hole density is 2/μm², and a silicon oxide film having a thickness of 0.02 μm is used as the dielectric layer 50, if a thickness of the capacitor 1C is about 0.2 mm, a capacitance density of about 500 nF/mm² can be achieved.

Fourth Embodiment

Figure 19:
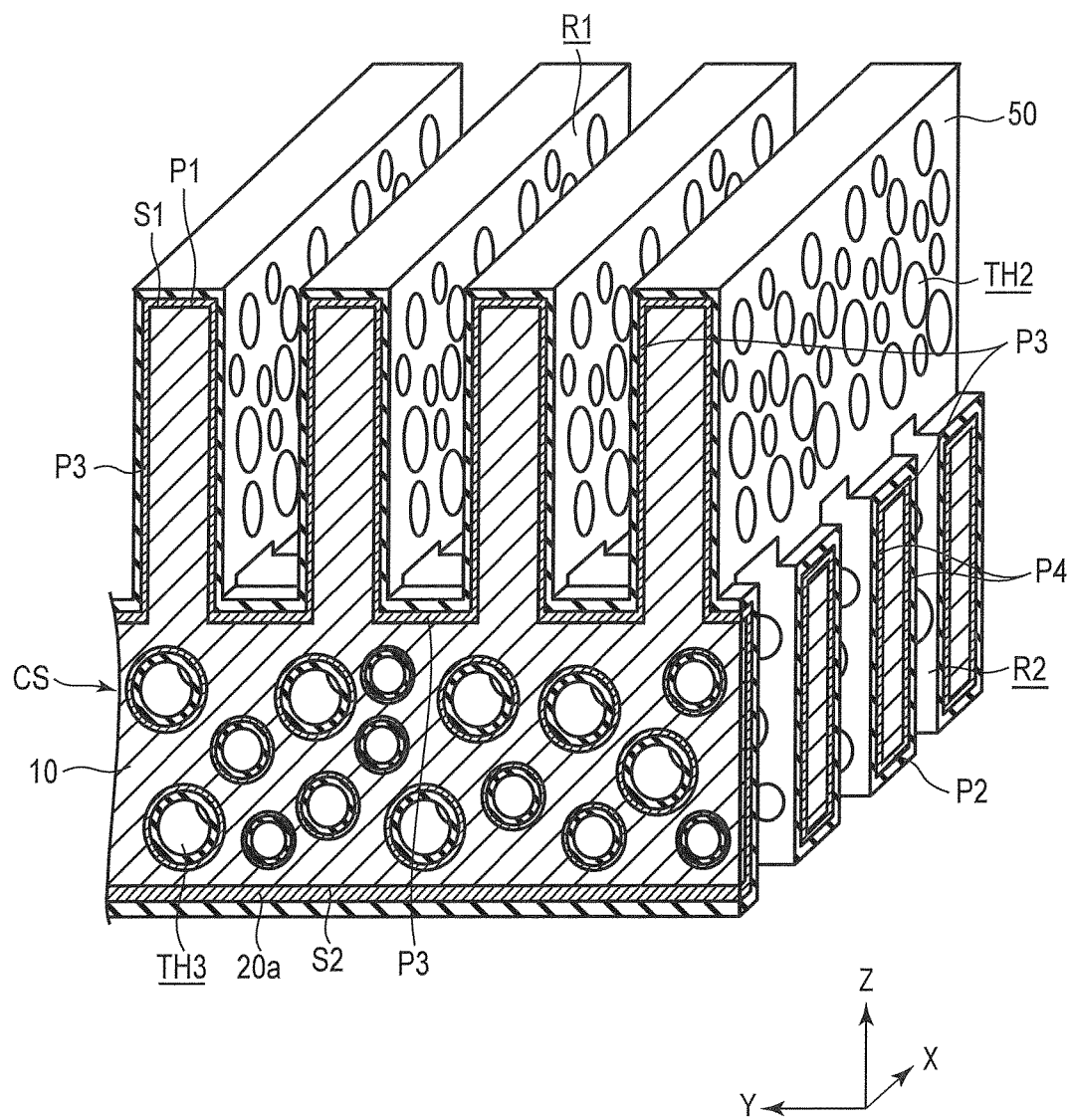
FIG. 19 is a perspective view schematically showing a part of a capacitor according to a fourth embodiment.

FIG. 19 is a perspective view schematically showing a part of the capacitor according to the fourth embodiment.

The capacitor according to the fourth embodiment is the same as the capacitor 1A according to the first embodiment, except that the following configuration is adopted.

That is, in this capacitor, one or more portions of the substrate 10 each sandwiched between two adjacent first recesses R1 are provided with one or more second through holes TH2 that connect one of the two adjacent first recesses R1 and the other. That is, in this capacitor, a side wall of the one of the two adjacent first recesses R1 corresponds to a first surface, and a side wall of the other one of the two adjacent first recesses R1 corresponds to a second surface.

Further, in this capacitor, one or more portions of the substrate 10 each sandwiched between two adjacent second recesses R2 are provided with one or more third through holes TH3 that connect one of the two adjacent second recesses R2 and the other. That is, in this capacitor, a side wall of the one of the two adjacent second recesses R2 also corresponds to a first surface, and a side wall of the other one of the two adjacent second recesses R2 also corresponds to a second surface.

Furthermore, in this capacitor, the stacked structure including the first conductive layer 20a, the dielectric layer 50, and the second conductive layer 20b is provided not only on the first main surface S1, the second main surface S2, the side walls and the bottom surfaces of the first recesses R1, and the side walls and the bottom surfaces of the second recesses R2, but also on the side walls of the second through holes TH2 and the side walls of the third through holes TH3. That is, the first conductive layer 20a covers the side walls of the second through holes TH2 and the side walls of the third through holes TH3, in addition to the first main surface S1, the second main surface S2, the side walls and the bottom surfaces of the first recesses R1, and the side walls and the bottom surfaces of the second recesses R2. Further, the second conductive layer 20b faces the side walls of the second through holes TH2 and the side walls of the third through holes TH3 in addition to facing the first main surface S1, the second main surface S2, and the side walls and the bottom surfaces of the first recesses R1, with the first conductive layer 20a interposed therebetween.

An average diameter of the second through holes TH2 and an average diameter of the third through holes TH3 are preferably within the range described for the second through holes TH2 in the third embodiment.

A proportion of a total area of openings of the second through holes TH2 in an area of a side wall of the first recess R1 is preferably within the range of the aperture ratio described for the side walls of the first recesses R1 in the third embodiment. Further, a proportion of a total area of openings of the third through holes TH3 in an area of a side wall of the second recess R2 is also preferably within the range of the aperture ratio described for the side walls of the first recesses R1 in the third embodiment.

A ratio of the number of the second through holes TH2 provided on a side wall of the first recess R1 to an area of the side wall is preferably within the range of the hole density described in the third embodiment. Further, a ratio of the number of third through holes TH3 provided on a side wall of the second recess R2 to an area of the side wall is preferably within the range of the hole density described in the third embodiment.

A distance between adjacent first recesses R1 and a distance between adjacent second recesses R2 are preferably within the range described for the distance between the adjacent first recesses R1 in the third embodiment.

The capacitor according to the fourth embodiment can be obtained, for example, by further performing a step for forming the second through holes TH2 and the third through holes TH3 in the manufacture of the capacitor 1A according to the first embodiment. The second through holes TH2 and the third through holes TH3 can be formed, for example, by the method described in the third embodiment.

That is, first, a plurality of first recesses R1 are formed on the first main surface S1 of the substrate 10, and a plurality of second recesses R2 are formed on the second main surface S2 of the substrate 10. The first recesses R1 and the second recesses R2 are formed, for example, by the MacEtch described in the first embodiment.

Next, a second catalyst layer containing a second noble metal is formed on the substrate 10 so as to partially cover the side walls of the first recesses R1 and the side walls of the second recesses R2.

Next, the substrate 10 is etched with an assist from the second noble metal as a catalyst so as to form the second through holes TH2 in one or more portions of the substrate 10 each sandwiched between two adjacent ones of the first recesses R1 and form the third through holes TH3 in one or more portions of the substrate 10 each sandwiched between two adjacent ones of the second recesses R2.

In the above process of forming the second through holes TH2 and the third through holes TH3, a hole having a smaller diameter than a preferred diameter or a non-through hole may be formed. These holes are then embedded by any of the first conductive layer 20a, the dielectric layer 50, and the second conductive layer 20b, or at these positions, the first conductive layer 20a, the dielectric layer 50, and the second conductive layer 20b are formed conformally.

Thereafter, the first conductive layer 20a, the dielectric layer 50, the second conductive layer 20b, the insulating layer 60, the electrodes 70a and 70b, etc. are formed by the same method as described in the first embodiment. In this way, the capacitor according to the fourth embodiment is obtained.

In this capacitor, the first recesses R1 and the second recesses R2 are provided, and the second through holes TH2 and the third through holes TH3 are provided on the side walls of the first recesses R1 and the side walls of the second recesses R2, respectively. The stacked structure of the first conductive layer 20a, the dielectric layer 50, and the second conductive layer 20b is provided not only on the first main surface S1, the second main surface S2, the side walls and the bottom surfaces of the first recesses R1, and the side walls and the bottom surfaces of the second recesses R2, but also on the side walls of the second through holes TH2 and the side walls of the third through holes TH3. Therefore, the capacitor 1C can achieve a large electric capacity.

In this capacitor, the first recesses R1 and the second recesses R2 are trenches. The above stacked structure is also provided on the side walls and the bottom surfaces of the trenches. Therefore, this capacitor can achieve a particularly large electric capacity.

For example, when the first recesses R1 and the second recesses R2 have a depth of 100 µm and a width of 1 µm, and a distance between adjacent first recesses R1 and a distance between adjacent second recesses R2 are both 1 µm, each of the side walls of the first recesses R1 and the second recesses provided with the second through holes TH2 and the third through holes TH3, respectively, has an aperture ratio of 30% and a hole density of $2/\mu m^2$, and a silicon oxide film having a thickness of 0.02 µm is used as the dielectric layer 50, if a thickness of the capacitor is assumed to be about 0.2 mm, a capacitance density of about 1000 $nF/mm^2$ can be achieved.

In this capacitor, the first recesses R1 and the second recesses R2 intersect each other, and the sum D1+D2 of their depths is equal to or greater than the thickness T of the substrate 10. Therefore, when the first recesses R1 and the second recesses R2 are formed, the first through holes TH1 are generated at the positions where they intersect. That is, unlike the case where the first recesses R1 and the second recesses R2 whose sum D1+D2 is smaller than the thickness T are merely formed on the first main surface S1 and the second main surface S2, respectively, there is no need to further perform a step of forming the first through holes TH1 in addition to the step of forming the first recesses R1 and the second recesses R2.

In this capacitor, an electrical connection between the portions of the above stacked structure that are located on the first main surface S1 and the second main surface S2 is performed using the first through holes TH1. Therefore, both electrodes 70a and 70b shown in FIG. 1 can be disposed on one side of the capacitor. That is, unlike the case where the first recesses R1 and the second recesses R2 are merely formed on the first main surface S1 and the second main surface S2, respectively, such that the sum D1+D2 is smaller than the thickness T, it is not necessary to form the electrodes 70a and 70b or wirings similar thereto on the second main surface S2, thus the number of steps can be greatly reduced. Furthermore, a capacitor adopting such a configuration can be easily mounted on a wiring board, etc.

Fifth Embodiment

Figure 21:
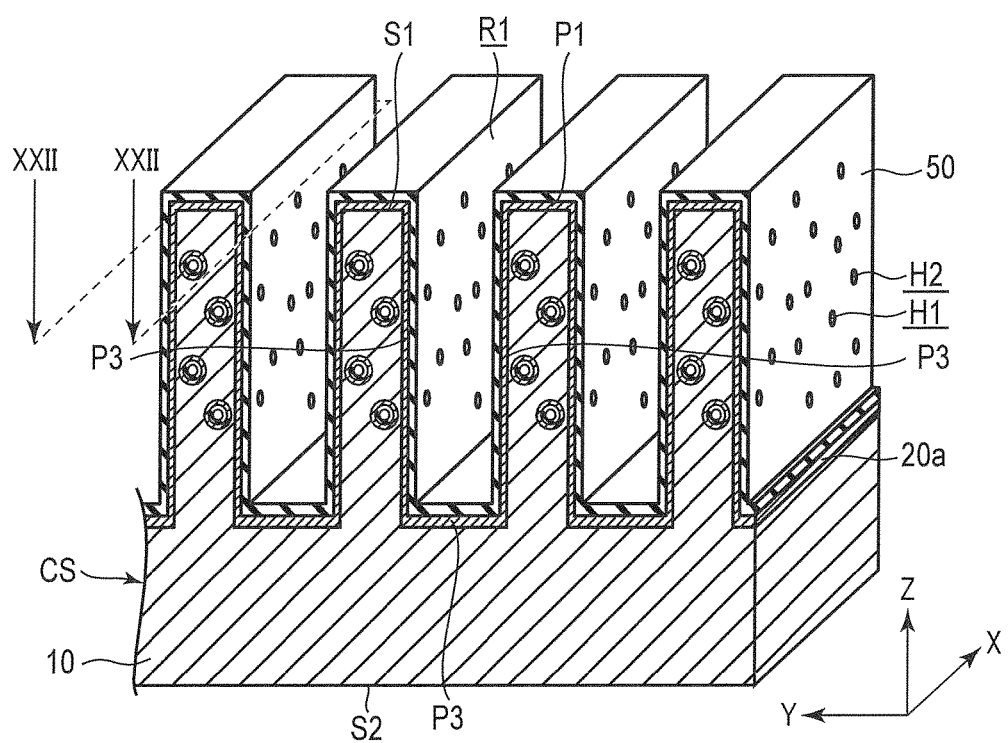
FIG. 21 is a perspective view schematically showing a part of the capacitor shown in FIG. 20.

FIG. 20 is a cross-sectional view schematically showing a capacitor according to a fifth embodiment. FIG. 21 is a perspective view schematically showing a part of the capacitor shown in FIG. 20. FIG. 22 is a cross-sectional view taken along a line XXII-XXII of the capacitor shown in FIG. 21. FIG. 21 illustrates a structure of the capacitor 1D illustrated in FIG. 20, from which the electrode 70b, the electrode 70a, the insulating layer 60, and the second conductive layer 20b are omitted.

The capacitor 1D shown in FIG. 20 is the same as the capacitor 1C according to the third embodiment except that the following configuration is adopted.

That is, in this capacitor 1D, as shown in FIG. 21, a plurality of first holes H1 and a plurality of second holes H2 are provided on the side walls of the first recesses R1, instead of the plurality of second through holes TH2.

As shown in FIG. 22, each of the first holes H1 extends in a first direction D1 inclined with respect to the side wall of the first recess R1. That is, length directions or depth directions of the first holes H1 are parallel to each other, and are inclined with respect to the side walls of the first recesses R1.

Each of the first holes H1 may be a blind hole that extends from one of two adjacent ones of two or more first recesses R1, and does not reach the other. Alternatively, each of the first holes H1 may be a through hole that connects the two adjacent ones of the two or more first recesses R1 to each other. Alternatively, one or more of the first holes H1 may be blind holes, and the rest of the first holes H1 may be through holes.

Each of the second holes H2 extends in a second direction D2 that intersects the first direction D1. That is, length directions or depth directions of the second holes H2 are parallel to each other, and are inclined with respect to the side walls of the first recesses R1. Each of the second holes H2 may or may not be connected to one or more of the first holes H1. Each of the second holes H2 may or may not intersect one or more of the first holes H1.

Each of the second holes H2 may be a blind hole that extends from one of two adjacent ones of two or more first recesses R1 and does not reach the other. Alternatively, each of the second holes H2 may be a through hole that connects the two adjacent ones of the two or more first recesses R1 to each other. Alternatively, one or more of the second holes H2 may be blind holes, and the rest of the second holes H2 may be through holes.

Further, in this capacitor 1D, as shown in FIGS. 20 to 22, the stacked structure including the first conductive layer 20a, the dielectric layer 50, and the second conductive layer 20b is provided not only on the first main surface S1 and the side walls and the bottom surfaces of the first recesses R1, but also on side walls of the first holes H1 and side walls of the second holes H2. That is, the first conductive layer 20a further covers the side walls of the first holes H1 and the side walls of the second holes H2 in addition to the first main surface S1 and the side walls and the bottom surfaces of the first recesses R1. In addition, the second conductive layer 20b further faces the side walls of the first holes H1 and the side walls of the second holes H2 in addition to facing the first main surface S1 and the side walls and the bottom surfaces of the first recesses R1, with the first conductive layer 20a interposed therebetween.

In this capacitor 1D, the first holes H1 are provided on the side walls of the first recesses R1. Thus, the substrate 10 of the capacitor 1D has a larger surface area than a substrate in which no hole is provided on the side walls of the first recesses R1.

Each of the first holes H1 extends in the first direction D1 inclined with respect to the side walls of the first recesses R1. Therefore, the substrate 10 of the capacitor 1D has a larger surface area than a substrate in which holes extending in a direction perpendicular to the side walls of the first recesses R1 are provided on the side walls of the first recesses R1.

In this capacitor 1D, the stacked structure of the first conductive layer 20a, the dielectric layer 50, and the second conductive layer 20b is provided not only on the first main surface S1 and the side walls and the bottom surfaces of the first recesses R1, but also on the side walls of the first holes H1.

Therefore, this capacitor 1D can achieve a larger electric capacity than a capacitor in which no hole is provided on the side walls of the first recesses R1. Further, this capacitor 1D can achieve a larger electric capacity than a capacitor provided with holes extending in a direction perpendicular to the side walls of the first recess R1.

For example, when an aperture ratio of the side walls of the first recesses R1 is 80%, a thickness of the first conductive layer 20a is 100 nm, and several first holes H1 are provided per 1 $\mu m^2$, a surface area of the first conductive layer 20a when an angle formed by the first direction D1 with respect to the side walls of the first recesses R1 is 45° can be about 1.36 times the surface area of the first conductive layer 20a when this angle is 90°. As is clear from this, a capacitor in which the first direction D1 is inclined with respect to the side walls of the first recesses R1 can achieve a larger electric capacity than a capacitor in which the first direction D1 is perpendicular to the side walls of the first recesses R1.

In addition, in this capacitor 1D, the second holes H2 are further provided on the side walls of the first recesses R1. If the second holes H2 are provided in addition to the first holes H1, a larger electric capacity can be achieved.

In the capacitor 1D, the first holes H1 are parallel to each other in the length direction, and the second holes H2 are also parallel to each other in the length direction. Thus, degradation in mechanical strength due to a connection between the first holes H1 or a connection between the second holes H2 less likely occurs.

Accordingly, according to this structure, it is possible to achieve a large electric capacity and a high mechanical strength.

The angle formed by the first direction D1 with respect to the side walls of the first recesses R1 and the angle formed by the second direction D2 with respect to the side walls of the first recesses R1 are preferably within a range of 10° to 80°, and more preferably within a range of 30° to 60°. When this angle is reduced, the mechanical strength of the capacitor 1D is lowered. When this angle is increased, an increase in electric capacity associated with tilting the first direction D1 or the second direction D2 is reduced.

The angle formed by the first direction D1 and the second direction D2 is preferably within a range of 20° to 160°, and more preferably within a range of 60° to 120°. The first direction D1 and the second direction D2 are particularly preferably orthogonal. When this angle is excessively decreased or increased, the mechanical strength of the capacitor 1D is lowered.

On the side walls of the first recesses R1, in addition to the first holes H1 and the second holes H2, other holes each extending in one direction and whose length directions are different from the first direction D1 and the second direction D2, may further be provided. For example, on the side walls of the first recesses R1, as such other holes, a plurality of holes whose length directions are parallel to each other and intersecting the first direction D1 and the second direction D2, and a plurality of holes whose length directions are parallel to each other and intersecting the first direction D1, the second direction D2, and the length directions of the previous holes, may further be provided.

Figure 23:
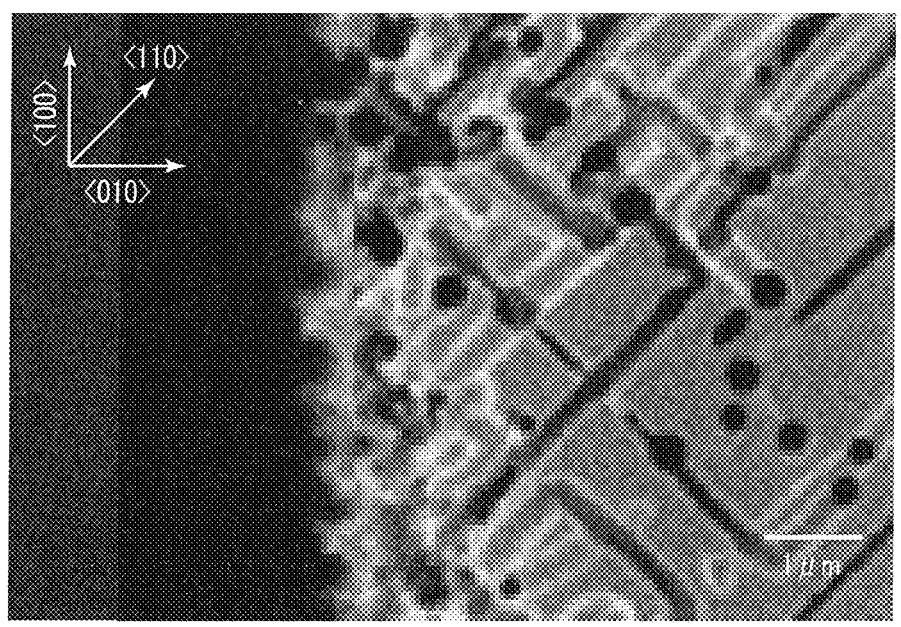
FIG. 23 is a micrograph showing a cross section of the capacitor shown in FIG. 21.

FIG. 23 is a photomicrograph showing a cross section of the capacitor shown in FIG. 21. The micrograph in FIG. 23 is a micrograph of the cross section corresponding to FIG. 22. In FIG. 23, a vertical direction is the X direction, and a horizontal direction is the Y direction.

The micrograph of FIG. 23 shows a cross section parallel to a (001) plane of a single-crystal silicon wafer having the (001) plane as a main surface and provided with a first recess R1 whose length direction is parallel to a <100> axis on the previous main surface. The first direction D1 and the second direction D2 described above are directions parallel to a <110> axis and a <−110> axis in FIG. 23, respectively. The structure in which the first direction D1 and the second direction D2 are orthogonal to each other as shown is particularly advantageous in achieving a large electric capacity and a high mechanical strength.

Each of an average diameter of the first holes H1 and an average diameter of the second holes H2 is preferably within the range described for the second through holes TH2 in the third embodiment. When the diameter of the first hole H1 and the diameter of the second hole H2 are reduced, more first holes H1 and second holes H2 can be arranged, thereby achieving a larger electric capacity. However, if the diameter of the first hole H1 and the diameter of the second hole H2 are reduced too much, there is a possibility that it may be difficult to form the stacked structure of the first conductive layer 20a, the dielectric layer 50, and the second conductive layer 20b in the first holes H1 and the second holes H2.

A proportion of a sum of a total area of openings of the first holes H1 and a total area of openings of the second holes H2 in an area of a side wall of the first recess R1, which is hereinafter referred to as an aperture ratio, is preferably within the range of the aperture ratio described for the side walls of the first recesses R1 in the third embodiment. In addition, a ratio of the total number of the first holes H1 and the second holes H2 provided on a side wall of the first recess R1 to an area of the side wall, which is hereinafter referred to as a hole density, is preferably within the range of the hole density described in the third embodiment.

When the aperture ratio and the hole density are increased, a larger electric capacity can be achieved. However, when the aperture ratio and the hole density are excessively increased, there is a possibility that it may be difficult to form the stacked structure of the first conductive layer 20a, the dielectric layer 50, and the second conductive layer 20b in the first holes H1 and the second holes H2. In addition, when the hole density is excessively increased, a surface area of the side wall of the first recess R1 tends to be reduced as the holes are easily connected. Therefore, there is a possibility that it may be difficult to achieve a large electric capacity.

In the capacitor 1D, the second holes H2 may be omitted.

Portions of the substrate 10 that are adjacent to the first recesses R1 are preferably made of crystal having a face-centered cubic structure. In this case, the main surface of the substrate 10 is preferably the (001) plane. Furthermore, in this case, the length directions of the first recesses R1 are preferably inclined with respect to the <110> axis. In this case, the first holes H1 and the second holes H2 can be formed by a method to be described below. Herein, as an example, a single-crystal silicon wafer is used as the substrate 10 made of crystal having a face-centered cubic structure and having the (001) plane as the main surface.

First, the first recesses R1 whose length directions are inclined with respect to the <110> axis are formed on the main surface of the substrate 10. For example, the first recesses R1 whose length directions are parallel to the <100> axis are formed. The first recesses R1 can be formed, for example, by the method described with reference to FIGS. 7 to 12.

Next, catalyst particles are deposited on the side walls of the first recesses R1. The catalyst particles can be deposited, for example, by the method described with reference to FIG. 17.

Next, the substrate 10 is etched with an assist from a noble metal as a catalyst to form the first holes H1 and the second holes H2. Specifically, the substrate 10 is immersed in an etching agent, and the etching agent is brought into contact with the substrate 10. As the etching agent, those described in the first embodiment can be used.

When the catalyst particles are in contact with one another and integrated, the etching proceeds in the thickness direction of a catalyst layer.

On the other hand, when the catalyst particles are spaced apart from one another, the orientation of the crystal constituting the substrate has an influence on the etching progress direction. For example, in the example described here, the etching is likely to proceed in a direction parallel to the <110> axis or its equivalent, e.g., the <−110> axis.

Therefore, according to the above method, the structure shown in FIGS. 20 to 23 is obtained.

Sixth Embodiment

Figure 24:
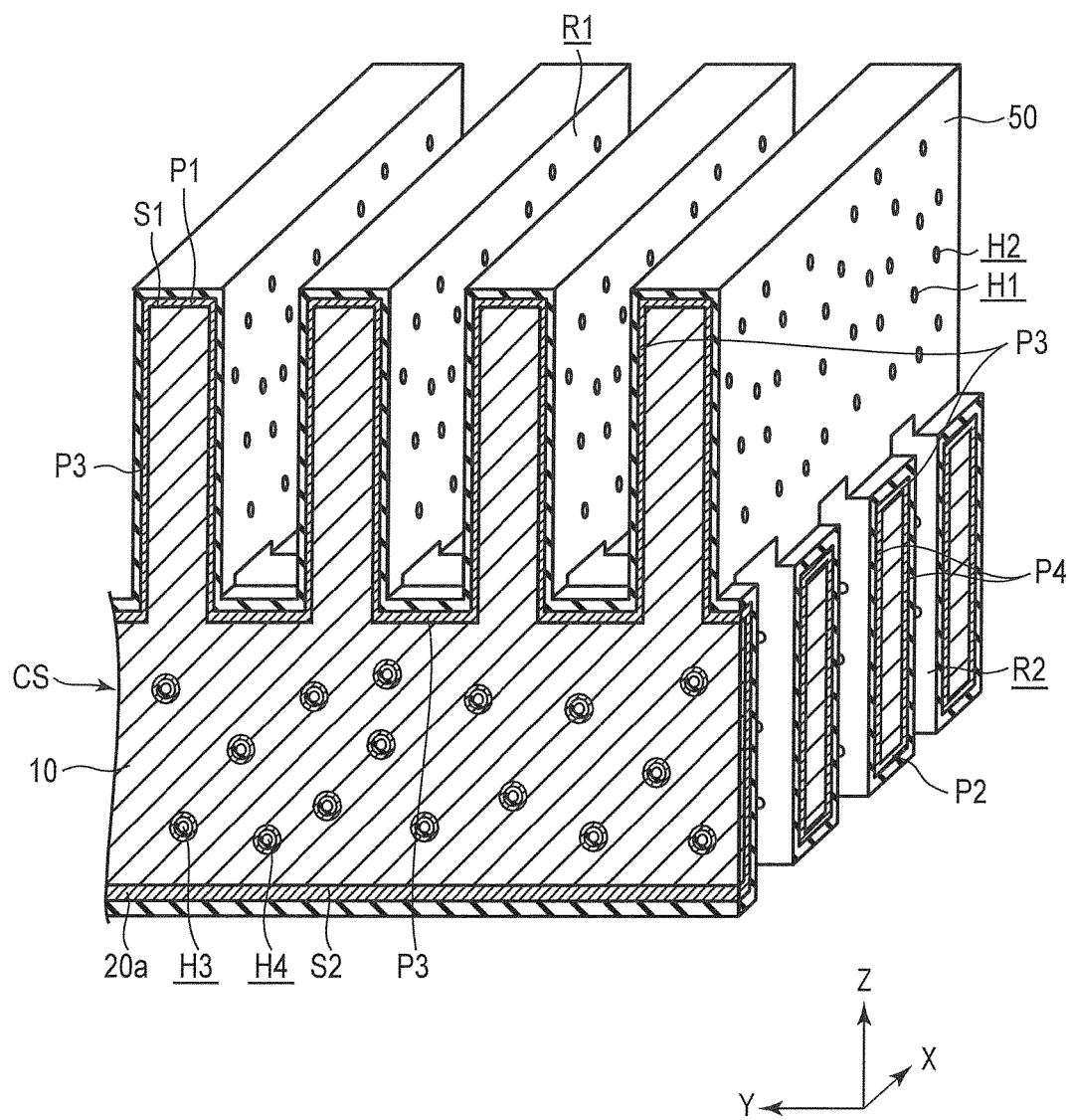
FIG. 24 is a perspective view schematically showing a part of a capacitor according to a sixth embodiment.

FIG. 24 is a perspective view schematically showing a part of the capacitor according to a sixth embodiment.

The capacitor according to the sixth embodiment is the same as the capacitor according to the fourth embodiment except that the following configuration is adopted.

That is, in this capacitor, as shown in FIG. 24, a plurality of first holes H1 and a plurality of second holes H2 are provided on the side walls of the first recesses R1, instead of the plurality of second through holes TH2. Further, a plurality of third holes H3 and a plurality of fourth holes H4 are provided on the side walls of the second recesses R2, instead of the plurality of third through holes TH3.

The first holes H1 and the second holes H2 in this capacitor are the same as the first holes H1 and the second holes H2 of the capacitor 1D according to the fifth embodiment.

Each of the third holes H3 extends in a third direction inclined with respect to the side walls of the second recesses R2. That is, length directions or depth directions of the third holes H3 are parallel to each other, and are inclined with respect to the side walls of the second recesses R2.

Each of the third holes H3 may be a blind hole that extends from one of two adjacent ones of two or more second recesses R2 and does not reach the other. Alternatively, each of the third holes H3 may be a through hole that connects the two adjacent ones of the two or more second recesses R2 to each other. Alternatively, one or more of the third holes H3 may be blind holes, and the rest of the third holes H3 may be through holes.

Each of the fourth holes H4 extends in a fourth direction that intersects the third direction. That is, length directions or depth directions of the fourth holes H4 are parallel to each other, and inclined with respect to the side walls of the second recesses R2. Each of the fourth holes H4 may or may not be connected to one or more of the third holes H3. Each of the fourth holes H4 may or may not intersect one or more of the third holes H3.

Each of the fourth holes H4 may be a blind hole that extends from one of the two adjacent ones of the two or more second recesses R2 and does not reach the other. Alternatively, each of the fourth holes H4 may be a through hole that connects the two adjacent ones of the two or more second recesses R2 to each other. Alternatively, one or more of the fourth holes H4 may be blind holes, and the rest of the fourth holes H4 may be through holes.

In addition, in this capacitor, the stacked structure including the first conductive layer 20a, the dielectric layer 50, and the second conductive layer 20b is provided not only on the first main surface S1, the second main surface S2, the side walls and the bottom surfaces of the first recesses R1, and the side walls and the bottom surfaces of the second recesses R2, but also on side walls of the first holes H1, side walls of the second holes H2, side walls of the third holes H3, and side walls of the fourth holes H4. That is, the first conductive layer 20a further covers the side walls of the first holes H1, the side walls of the second holes H2, the side walls of the third holes H3, and the side walls of the fourth holes H4, in addition to the first main surface S1, the second main surface S2, the side walls and the bottom surfaces of the first recesses R1, and the side walls and the bottom surfaces of the second recesses R2. In addition, the second conductive layer 20b further faces the side walls of the first holes H1, the side walls of the second holes H2, the side walls of the third holes H3, and the side walls of the fourth holes H4, in addition to facing the first main surface S1, the second main surface S2, and the side walls and the bottom surfaces of the first recesses R1, with the first conductive layer 20a interposed therebetween.

As described above, this capacitor is the same as the capacitor according to the fourth embodiment, except that the first holes H1 and the second holes H2 are provided instead of the second through holes TH2, and the third holes H3 and the fourth holes H4 are provided instead of the third through holes TH3. Therefore, this capacitor has the same effects as the capacitor according to the fourth embodiment except for the matters described in association with the second through holes TH2 and the third through holes TH3.

In this capacitor, the first holes H1, the second holes H2, the third holes H3, and the fourth holes H4 are provided. Therefore, the substrate 10 of this capacitor has a larger surface area than that of a substrate in which no hole is provided on any of the side walls of the first recesses R1 and the second recesses R2.

Each of the first holes H1 and the second holes H2 extends in a direction inclined with respect to the side walls of the first recesses R1, and each of the third holes H3 and the fourth holes H4 extends in a direction inclined with respect to the side walls of the second recesses R2. Therefore, the substrate 10 of this capacitor has a surface area larger than that of a substrate in which the side walls of the first recesses R1 are provided with holes extending in a direction perpendicular to these side walls, and the side walls of the second recesses R2 are provided with holes extending in a direction perpendicular to these side walls.

The stacked structure of the first conductive layer 20a, the dielectric layer 50, and the second conductive layer 20b is provided not only on the first main surface S1, the second main surface S2, the side walls and the bottom surfaces of the first recesses R1, and the side walls and the bottom surfaces of the second recesses R2, but also on the side walls of the first holes H1, the second holes H2, the third holes H3, and the fourth holes H4.

Therefore, this capacitor can achieve a larger electric capacity than a capacitor in which no hole is provided on any of the side walls of the first recesses R1 and the second recesses R2. In addition, this capacitor can achieve a larger electric capacity than a capacitor in which the side walls of the first recesses R1 are provided with holes extending in a direction perpendicular to the side walls, and the side walls of the second recesses R2 are provided with holes extending in a direction perpendicular to the side walls.

Each of an angle formed by the first direction D1 with respect to the side walls of the first recesses R1, an angle formed by the second direction D2 with respect to the side walls of the first recesses R1, an angle formed by the third direction with respect to the side walls of the second recesses R2, and an angle formed by the fourth direction with respect to the side walls of the second recesses R2 is preferably within the range described for the angle formed by the first direction D1 and the second direction D2 with respect to the side walls of the first recesses R1 in the fifth embodiment.

Each of an angle formed by the first direction D1 and the second direction D2 and an angle formed by the third direction and the fourth direction is preferably within the range described for the angle formed by the first direction D1 and the second direction D2 in the fifth embodiment.

It is preferable that one of the first direction D1 and the second direction D2 and one of the third direction and the fourth direction are parallel or orthogonal. In this case, formation of the holes is easy.

Each of an average diameter of the first hole H1, an average diameter of the second holes H2, an average diameter of the third holes H3, and an average diameter of the fourth holes H4 is preferably within the range described for the second through holes TH2 in the third embodiment.

An aperture ratio of a side wall of the first recess R1, i.e., a proportion of a sum of a total area of openings of the first holes H1 and a total area of openings of the second holes H2 in an area of this side wall is preferably within the range of the aperture ratio described for the side walls of the first recesses R1 in the third embodiment. Also, an aperture ratio of a side wall of the second recess R2, i.e., a proportion of a sum of a total area of openings of the third holes H3 and a total area of openings of the fourth holes H4 in an area of this side wall, is also preferably within the range of the aperture ratio described for the side walls of the first recesses R1 in the third embodiment.

A hole density in a side wall of the first recess R1, i.e., a ratio of the total number of the first holes H1 and the second holes H2 provided on this side wall to an area of the side wall is preferably within the range of the hole density described in the third embodiment. In addition, a hole density in a side wall of the second recess R2, i.e., a ratio of the total number of the third holes H3 and the fourth holes H4 provided on this side wall to an area of the side wall is also preferably within the range of the hole density described in the third embodiment.

When the aperture ratio and the hole density are increased, a larger electric capacity can be achieved. However, if the aperture ratio and the hole density are excessively increased, there is a possibility that it may be difficult to form the stacked structure of the first conductive layer 20a, the dielectric layer 50, and the second conductive layer 20b in the first holes H1, the second holes H2, the third holes H3, and the fourth holes H4. Moreover, when the hole density is excessively increased, surface areas of the side walls of the first recesses R1 and the second recesses R2 are likely to be reduced as the holes are easily connected to each other. Therefore, there is a possibility that it may also be difficult to achieve a large electric capacity.

In this capacitor, if one or more of the first holes H1, the second holes H2, the third holes H3, and the fourth holes H4 are provided, the rest may be omitted.

Of the substrate 10, portions adjacent to the first recesses R1 and portions adjacent to the second recesses R2 are preferably made of crystal having a face-centered cubic structure. In this case, it is preferable that the first main surface S1 is the (001) plane, and the second main surface S2 is a plane parallel to the first main surface S1. Furthermore, in this case, it is preferable that the length directions of the first recesses R1 and the second recesses R2 are inclined with respect to the <110> axis. With such a structure, the first holes H1, the second holes H2, the third holes H3, and the fourth holes H4 can be formed with a method to be described below. Herein, as an example, a single-crystal silicon wafer is used as the substrate 10 made of crystal having a face-centered cubic structure, in which the first main surface S1 is the (001) plane, and the second main surface S2 is parallel to the first main surface S1.

First, the first recesses R1 whose length directions are inclined with respect to the <110> axis are formed on the first main surface S1 of the substrate 10, and the second recesses R2 whose length directions are inclined with respect to the <110> axis are formed on the second main surface S2 of the substrate 10. The first recesses R1 and the second recesses R2 are formed, for example, by the MacEtch described in the first embodiment.

Next, a second catalyst layer containing a second noble metal is formed on the substrate 10 so as to partially cover the side walls of the first recesses R1 and the side walls of the second recesses R2.

Then, the substrate 10 is etched with an assist from the second noble metal as a catalyst to form the first holes H1 and the second holes H2 on the side walls of the first recesses R1, and form the third holes H3 and the fourth holes H4 on the side walls of the second recesses R2.

As described in the fifth embodiment, when the catalyst particles are spaced apart from one another, the orientation of the crystal constituting the substrate has an influence on the etching progress direction. For example, in the example described here, the etching is likely to proceed in a direction parallel to the <110> axis or its equivalent, e.g., the <–110> axis. Accordingly, according to the method described above, the structure shown in FIG. 24 is obtained.

Although several embodiments of the present invention have been described, these embodiments are presented by way of example and are not intended to limit the scope of the invention. These embodiments can be implemented in various other forms, and various omissions, replacements, and changes can be made without departing from the spirit of the invention. The embodiments and their modifications are covered by the accompanying claims and their equivalents, as would fall within the scope and the gist of the disclosure.

For example, similar to the capacitor 1B according to the second embodiment, the capacitors according to the third to sixth embodiments may include a stacked structure of first conductive layer 20a, the first dielectric layer 50a, the second conductive layer 20b, the second dielectric layer 50b, and the third conductive layer 20c, instead of the stacked structure of the first conductive layer 20a, the dielectric layer 50, and the second conductive layer 20b.

In addition, the second through holes TH2 or the third through holes TH3 may be omitted from the capacitor according to the fourth embodiment.

The invention claimed is:

1. A capacitor comprising:
    a substrate having a first surface and a second surface and provided with one or more first through holes each extending from the first surface to the second surface;
    a first conductive layer covering the first surface, the second surface, and side walls of the one or more first through holes;
    a second conductive layer facing the first surface, the second surface, and the side walls of the one or more first through holes, with the first conductive layer interposed therebetween; and
    a dielectric layer interposed between the first conductive layer and the second conductive layer,
    wherein the first surface and the second surface are first and second main surfaces perpendicular to a thickness direction of the substrate, respectively, and the one or more first through holes are one or more through holes each extending in the thickness direction,
    wherein one or more first trenches are provided on the first main surface, one or more second trenches are provided on the second main surface, a length direction of the one or more first trenches and a length direction of the one or more second trenches intersect each other, and the one or more first trenches and the one or more second trenches are connected to each other to form the one or more first through holes, and
    wherein the first conductive layer further covers side walls and bottom surfaces of the one or more first trenches and side walls and bottom surfaces of the one or more second trenches, and the second conductive layer further faces the side walls and the bottom surfaces of the one or more first trenches and the side walls and the bottom surfaces of the one or more second trenches, with the first conductive layer interposed therebetween.

2. The capacitor according to claim 1, wherein a sum of a depth of each of the one or more first trenches and a depth of each of the one or more second trenches is equal to or greater than a thickness of the substrate.

3. The capacitor according to claim 1, wherein the one or more first trenches and the one or more second trenches form the one or more first through holes at positions where the one or more first trenches and the one or more second trenches intersect.

4. The capacitor according to claim 1, further comprising:
    an insulating layer facing the first main surface with a portion of the first conductive layer, a portion of the second conductive layer, and a portion of the dielectric layer interposed therebetween,
    a first electrode provided on the insulating layer and electrically connected to the first conductive layer; and
    a second electrode provided on the insulating layer and electrically connected to the second conductive layer.

5. A capacitor, comprising:
    a substrate having a first surface and a second surface and provided with one or more first through holes each extending from the first surface to the second surface;
    a first conductive layer covering the first surface, the second surface, and side walls of the one or more first through holes;

a second conductive layer facing the first surface, the second surface, and the side walls of the one or more first through holes, with the first conductive layer interposed therebetween; and a dielectric layer interposed between the first conductive layer and the second conductive layer, wherein the first surface and the second surface are first and second main surfaces perpendicular to a thickness direction of the substrate, respectively, and the one or more first through holes are one or more through holes each extending in the thickness direction, wherein one or more first trenches are provided on the first main surface, one or more second trenches are provided on the second main surface, a length direction of the one or more first trenches and a length direction of the one or more second trenches intersect each other, and the one or more first trenches and the one or more second trenches are connected to each other to form the one or more first through holes, and wherein the one or more first trenches are a plurality of first trenches, one or more portions of the substrate each sandwiched between two adjacent ones of the plurality of first trenches are provided with one or more second through holes connecting one of the two adjacent first trenches to the other, the first conductive layer further covers side walls of the one or more second through holes, and the second conductive layer further faces the side walls of the one or more second through holes with the first conductive layer interposed therebetween.

6. The capacitor according to claim 5, further comprising:
an insulating layer facing the first main surface with a portion of the first conductive layer, a portion of the second conductive layer, and a portion of the dielectric layer interposed therebetween;
a first electrode provided on the insulating layer and electrically connected to the first conductive layer; and
a second electrode provided on the insulating layer and electrically connected to the second conductive layer.

7. A capacitor, comprising:
a substrate having a first surface and a second surface and provided with one or more first through holes each extending from the first surface to the second surface;
a first conductive layer covering the first surface, the second surface, and side walls of the one or more first through holes;
a second conductive layer facing the first surface, the second surface, and the side walls of the one or more first through holes, with the first conductive layer interposed therebetween; and
a dielectric layer interposed between the first conductive layer and the second conductive layer, wherein the first surface and the second surface are first and second main surfaces perpendicular to a thickness direction of the substrate, respectively, and the one or more first through holes are one or more through holes each extending in the thickness direction, wherein one or more first trenches are provided on the first main surface, one or more second trenches are provided on the second main surface, a length direction of the one or more first trenches and a length direction of the one or more second trenches intersect each other, and the one or more first trenches and the one or more second trenches are connected to each other to form the one or more first through holes, and wherein the one or more second trenches are a plurality of second trenches, one or more portions of the substrate each sandwiched between two adjacent ones of the plurality of second trenches are provided with one or more third through holes connecting one of the two adjacent second trenches to the other, the first conductive layer further covers side walls of the one or more third through holes, and the second conductive layer further faces the side walls of the one or more third through holes with the first conductive layer interposed therebetween.

8. The capacitor according to claim 7, further comprising:
an insulating layer facing the first main surface with a portion of the first conductive layer, a portion of the second conductive layer, and a portion of the dielectric layer interposed therebetween;
a first electrode provided on the insulating layer and electrically connected to the first conductive layer; and
a second electrode provided on the insulating layer and electrically connected to the second conductive layer.

* * * * *